US012683527B2

(12) United States Patent
Lakshmi Narasimha et al.

(10) Patent No.: US 12,683,527 B2
(45) Date of Patent: Jul. 14, 2026

(54) SENSORLESS TRAPEZOIDAL MOTOR CONTROL

(71) Applicant: TEXAS INSTRUMENTS INCORPORATED, Dallas, TX (US)

(72) Inventors: Rajan Lakshmi Narasimha, Allen, TX (US); David P Magee, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 40 days.

(21) Appl. No.: 18/477,955

(22) Filed: Sep. 29, 2023

(65) Prior Publication Data
US 2025/0112568 A1    Apr. 3, 2025

(51) Int. Cl.
*H02P 6/08* (2016.01)
*H02P 6/15* (2016.01)
*H02P 6/182* (2016.01)
*H03M 1/12* (2006.01)

(52) U.S. Cl.
CPC .............. *H02P 6/182* (2013.01); *H02P 6/085* (2013.01); *H02P 6/157* (2016.02); *H03M 1/1255* (2013.01)

(58) Field of Classification Search
CPC .......... H02P 6/085; H02P 6/157; H02P 6/182; H02P 6/08; H03M 1/1255

USPC ...................................................... 318/400.34
See application file for complete search history.

(56) References Cited

U.S. PATENT DOCUMENTS

| | | | | |
|---|---|---|---|---|
| 10,594,237 B2 * | 3/2020 | Buckley | ................... | H02P 6/17 |
| 11,705,834 B2 | 7/2023 | Lakshmi Narasimha et al. | | |
| 2002/0140391 A1 * | 10/2002 | Sakamoto | .............. | G11B 19/28 |
| | | | | 318/560 |
| 2016/0087563 A1 * | 3/2016 | Magee | .................... | H02P 6/182 |
| | | | | 318/400.34 |
| 2017/0054391 A1 * | 2/2017 | Qian | ....................... | H02P 27/08 |

* cited by examiner

*Primary Examiner* — Gabriel Agared
(74) *Attorney, Agent, or Firm* — Zhenhai Fu; Frank D. Cimino

(57) ABSTRACT

A method includes receiving a first measurement signal representing a first time between transitions of a motor commutation state. The method further includes receiving a second measurement signal representing a second time between transitions of a motor floating terminal voltage. The method further includes determining a motor speed state based on a combination of the first and second measurement signals, determining a motor commutation state based on the motor speed state and the motor floating terminal voltage; and providing a control signal to a motor inverter based on the motor commutations state.

23 Claims, 16 Drawing Sheets

1100

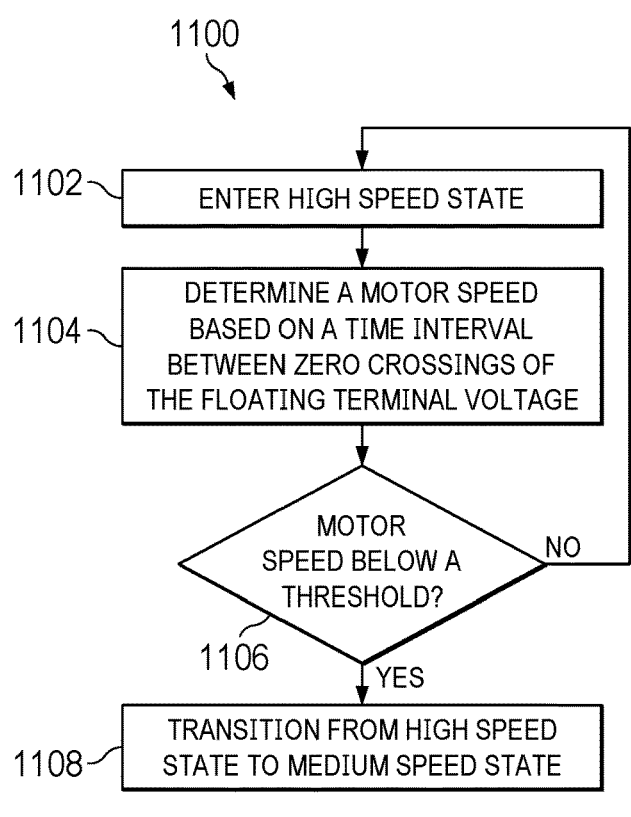

1102 ENTER HIGH SPEED STATE

1104 DETERMINE A MOTOR SPEED BASED ON A TIME INTERVAL BETWEEN ZERO CROSSINGS OF THE FLOATING TERMINAL VOLTAGE

1106 MOTOR SPEED BELOW A THRESHOLD?

NO

YES

1108 TRANSITION FROM HIGH SPEED STATE TO MEDIUM SPEED STATE

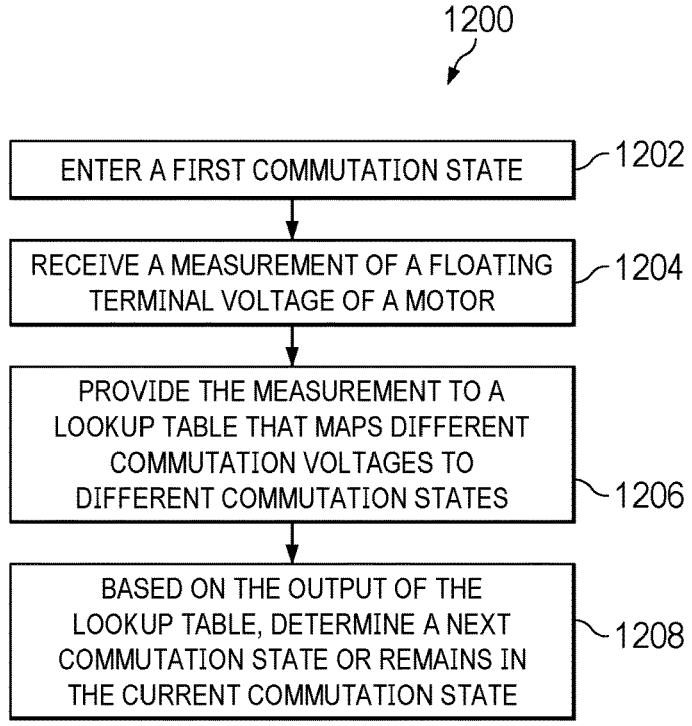

ENTER A FIRST COMMUTATION STATE 1202

RECEIVE A MEASUREMENT OF A FLOATING TERMINAL VOLTAGE OF A MOTOR 1204

PROVIDE THE MEASUREMENT TO A LOOKUP TABLE THAT MAPS DIFFERENT COMMUTATION VOLTAGES TO DIFFERENT COMMUTATION STATES 1206

BASED ON THE OUTPUT OF THE LOOKUP TABLE, DETERMINE A NEXT COMMUTATION STATE OR REMAINS IN THE CURRENT COMMUTATION STATE 1208

FIG. 12

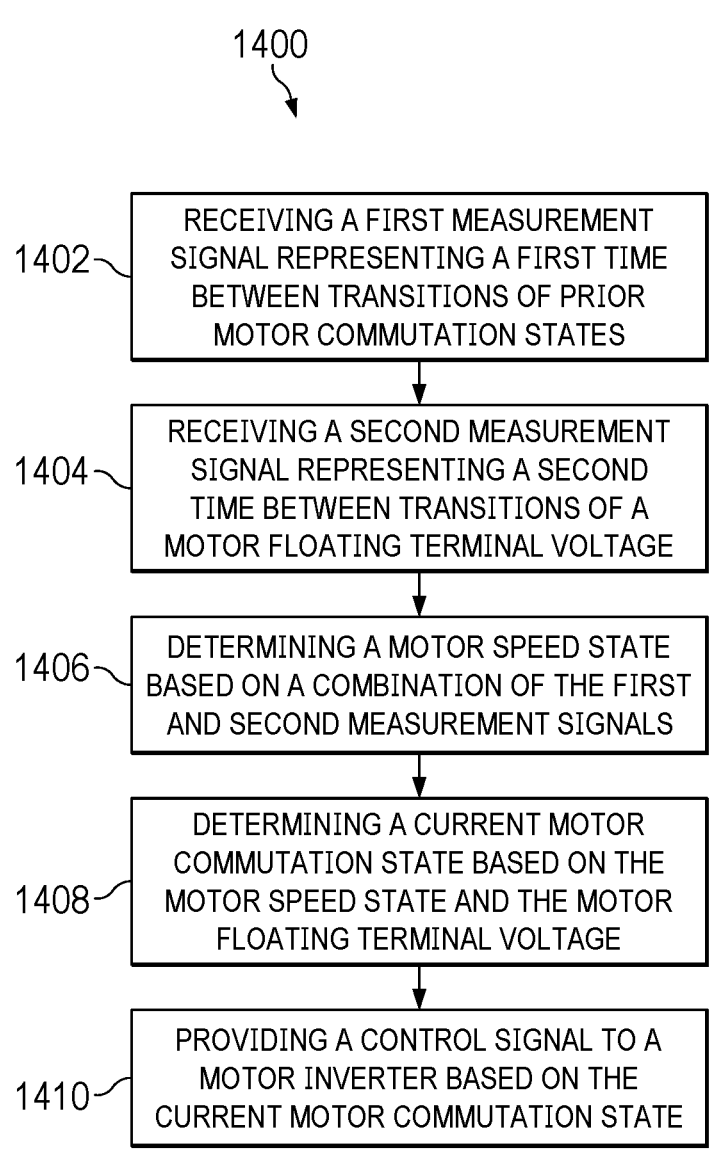

1400

1402 — RECEIVING A FIRST MEASUREMENT SIGNAL REPRESENTING A FIRST TIME BETWEEN TRANSITIONS OF PRIOR MOTOR COMMUTATION STATES

1404 — RECEIVING A SECOND MEASUREMENT SIGNAL REPRESENTING A SECOND TIME BETWEEN TRANSITIONS OF A MOTOR FLOATING TERMINAL VOLTAGE

1406 — DETERMINING A MOTOR SPEED STATE BASED ON A COMBINATION OF THE FIRST AND SECOND MEASUREMENT SIGNALS

1408 — DETERMINING A CURRENT MOTOR COMMUTATION STATE BASED ON THE MOTOR SPEED STATE AND THE MOTOR FLOATING TERMINAL VOLTAGE

1410 — PROVIDING A CONTROL SIGNAL TO A MOTOR INVERTER BASED ON THE CURRENT MOTOR COMMUTATION STATE

FIG. 14

SENSORLESS TRAPEZOIDAL MOTOR CONTROL

BACKGROUND

Trapezoidal control is a widely used commutation technique with motors such as three-phase brushless direct-current (BLDC) motors, where the back-electromotive-force (BEMF) waveform can have a trapezoidal shape. Trapezoidal control is used in multiple motor applications, such as for fans, power tools, compressors, etc.

A BLDC motor includes two parts rotatable with respect to each other, a rotor and a stator. The stator generates a magnetic field to rotate the rotor. Some motor control systems include Hall effect sensors and/or optical encoders to determine the position of the rotor relative to the stator and/or to measure the speed of the rotor, which is the motor's speed. A sensorless motor control system does not include (or otherwise does not rely on) Hall effect sensors and optical encoders to determine the position/speed of the rotor.

SUMMARY

In an example, an apparatus includes a voltage processing circuit having voltage processing inputs, a control input, and a motor floating terminal voltage output. The apparatus also includes a comparator having a comparator input and a comparator output. The first comparator input is coupled to the motor floating terminal voltage output. An analog-to-digital converter (ADC) has an ADC input and an ADC output. The ADC input is coupled to the motor floating terminal voltage output or the voltage processing inputs. A time measurement circuit has a first voltage transition input, a commutation state input, a first time measurement output, and a second time measurement output. The first voltage transition input is coupled to the comparator output. A motor commutation controller has a signal measurement input, a second voltage transition input, a speed state input, and a commutation state output. The signal measurement input is coupled to the ADC output. The second voltage transition is input coupled to the comparator output, and the commutation state output is coupled to the control input and the commutation state input. A motor speed circuit has a first time measurement input, a second time measurement input, and a speed state output. The first time measurement input is coupled to the first time measurement output, and the second time measurement input is coupled to the second time measurement output. The speed state output is coupled to the speed state input. A motor inverter driver has inverter driver outputs coupled to the voltage processing inputs.

In another example, a method includes receiving a first measurement signal representing a first time of transition between motor commutation states and receiving a second measurement signal representing a second time between transitions of a motor floating terminal voltage. The method also includes determining a motor speed state based on a combination of the first and second measurement signals, determining a motor commutation state based on the motor speed state and one of the motor floating terminal voltage or the second measurement signal, and providing a control signal to a motor inverter based on the motor commutations state.

In another example, a non-transitory computer readable medium stores instructions that, when executed by processor circuitry, cause the processor circuitry to: receive a first measurement signal representing a first time of transition between motor commutation states; receive a second measurement signal representing a second time between transitions of a motor floating terminal voltage; determine a motor speed state based on a combination of the first and second measurement signals; determine a motor commutation state based on the motor speed state and one of the motor floating terminal voltage or the second measurement signal; and provide a control signal to a motor inverter based on the motor commutations state.

BRIEF DESCRIPTION OF THE DRAWINGS

FIG. 11 is a flowchart of a method for transitioning between different speed states of a motor system, in an example.

FIG. 12 is a flowchart of a method for transitioning between different commutation states of a motor system, in an example.

FIG. 14 is a flowchart of a method of controlling a motor, in an example.

DETAILED DESCRIPTION

Figure 1:
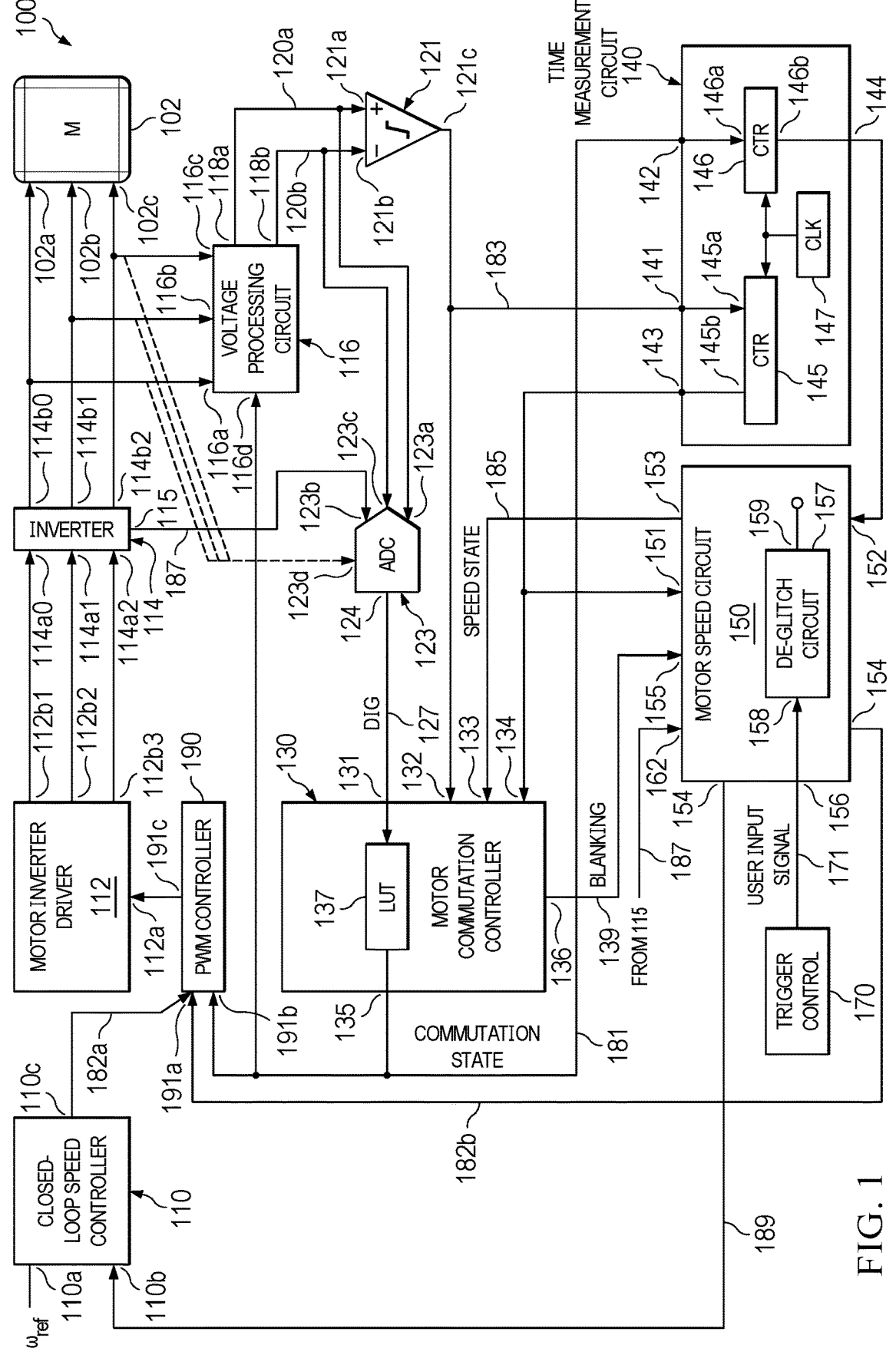
FIG. 1 is a schematic diagram of a motor system, in an example.

The same reference numbers or other reference designators are used in the drawings to designate the same or similar (either by function and/or structure) features.

As described above, some motor control systems include Hall effect sensors and/or optical encoders to measure the instantaneous position of the rotor relative to the stator, which indicates the instantaneous commutation state of the motor. By measuring changes in the instantaneous position of the rotor with respect to time, the instantaneous rotor speed can also be determined. A controller can implement closed-loop control of motor commutation state, where the controller monitors the instantaneous motor commutation state, determines when the motor should transition to the next motor commutation state, and adjusts control signals to the stator at the determined time to effect the transition. Also, a controller can implement a closed-loop control of motor speed, where the controller monitors the instantaneous motor speed, and adjusts the control signals to the stator so that the instantaneous motor speed converges to a target speed. Such arrangements can improve motor control precision. However, including sensors, such as Hall sensor and optical encoder, with a BLDC to measure position/speed adds complexity and cost to the motor system.

The examples described herein pertain to sensorless motor systems which do not include (or otherwise do not rely on) Hall effect sensors and optical encoders to determine the position/speed of the rotor, which can reduce the overall complexity and cost of the motor system. The illustrative sensor motor system measures motor voltage and/or motor current, determines a speed state of the motor based on the measurements, and depending on the speed state, uses different techniques to determine the instantaneous motor speed and the instantaneous motor commutation state. Such arrangements advantageously allow accurate determinations of instantaneous motor speed and instantaneous motor commutation state from where the motor is idle (zero rotation speed) to where the motor rotates at a maximum rated speed ($\omega_{max}$), which allow closed-loop control of motor commutation state and/or motor speed across a wide range of rotation speeds and across a wide range of torques. All these can improve motor control precision with reduced system cost and complexity.

FIG. 1 is a schematic diagram of an illustrative motor system 100 which includes a motor 102, a motor inverter driver 112, an inverter 114, and a voltage processing circuit 116. Motor system also includes a comparator 121, an analog-to-digital converter (ADC) 123, a motor commutation controller 130, a time measurement circuit 140, a motor speed circuit 150, and a PWM controller 190. In one example, the motor system 100 can include a trigger control 170 to provide signals to activate the motor and to set a speed of the motor. Optionally, motor system 100 can include a closed-loop speed controller 110, which can compare the motor's speed West to a reference speed @ref, and adjust the motor's speed West to match reference speed @ref, thereby providing closed-loop control of the speed.

In one example, motor 102 is a three-phase brushless direct-current (BLDC) motor including three voltage terminals 102a, 102b, and 102c. A BLDC motor includes two parts which are rotatable with respect to each other, a rotor and a stator. In response to currents supplied by inverter 114, the motor's stator generates a magnetic field to rotate the rotor. Motor system 100 is a sensorless motor system which does not include (or otherwise does not rely on) a Hall effect sensor or an optical encoder to sense rotor position/speed. Instead, and as described below, motor system 100 determines the commutation state and the speed of motor 102 based on measuring the motor's phase voltages and currents.

As to be described in detail below, inverter 114 has three half-bridge circuits each having an output coupled to, respectively, outputs 11460, 114b1, and 114b2. Output 11460 of inverter 114 is coupled to voltage terminal 102a, output 114b1 of inverter 114 is coupled to voltage terminal 102b, and output 114b2 of inverter 114 is coupled to voltage terminal 102c. Each half-bridge circuit has an input coupled to, respectively, inputs 114a0, 114a1, and 114a2. Inverter 114 provide voltages at output 114b0, 114b1, and 114b2 based on control signals at inputs 114a0, 114a1, and 114a2 to the half bridges to control the commutation and speed of rotation of the motor.

PWM controller 190 has inputs 191a and 191b and an output 191c. Input 191a of PWM controller 190 is coupled to one of an output 110c of optional closed-loop speed controller 110 or output 154 of motor speed circuit 150 to receive speed control signals 182a or 182b, respectively. Input 191b of PWM controller 190 is coupled to an output 135 of motor commutation controller 130. Motor inverter driver 112 can provide control signals to inverter 114. Motor inverter driver 112 has an inverter driver input 112a and inverter driver outputs 112b1, 112b2, and 112b3. Driver input 112a is coupled to output 191c of PWM controller 190 to receive a multi-cycle control signal from PWM controller 190. Motor inverter driver 112 can generate control signals at outputs 112b1, 112b2, and 112b3 for the three half bridges of inverter 114 based on commutation state signal 181 and speed signal 182b. For example, based on commutation state signal 181, motor inverter driver 112 can generate control signals to set the on/off state of the devices in each bridge circuit. Also, based on the speed signal 182b, motor inverter driver 112 can set the on-duration of the devices in each bridge circuit.

Voltage processing circuit 116 has voltage inputs 116a, 116b, and 116c, a control input 116d, and outputs 118a and 118b. Control input 116d is coupled to motor commutation controller 130. Voltage input 116a is coupled to output 11460 of inverter 114, voltage input 116b is coupled to output 114b1 of inverter 114, and voltage input 116c is coupled to output 114b2 of inverter 114. As to be described below, voltage processing circuit 116 can provide a signal 120a representing a floating terminal voltage of motor 102 at output 118a. Voltage processing circuit 116 can also provide a signal 120b representing a neutral voltage $V_n$ at output 118b. Voltage processing circuit 116 can provide signals 120a and 120b based on voltages at outputs 114b0, 114b1, and 114b2 of inverter 114, and based on a commutation state of motor 102.

ADC 123 has an ADC inputs 123a, 123b, 123c, and an optional inputs 123d, and ADC outputs 124. ADC input 123a is coupled to output 118a of voltage processing circuit 116, ADC input 123b is coupled to a current sensing output 115 of inverter 114, and ADC input 123c is coupled to output 118b of voltage processing circuit 116. ADC 123 can receive signal 120a representing a floating terminal voltage at ADC input 123a and generate a digital representation of the floating terminal voltage at ADC output 124. ADC 123 can also receive signal 120b representing the neutral voltage $V_n$ at ADC input 123c and generate a digital representation of the neutral voltage at ADC output 124. Further, ADC 123 can also receive a current measurement signal 187 representing a motor current at ADC input 123b and generate a digital representation of the motor current at ADC output 124. ADC 123 can provide digital representation of the floating terminal voltage, neutral voltage $V_n$, and motor current as digital signals 127. In some examples, optional input 123d is coupled to outputs 114b0, 114b1, and 114b2. Further, ADC 123 can receive voltages at inverter 114 outputs 114b0, 114b1, and 114b2 and deliver sampled and digital representations of voltages at outputs 114b0, 114b1, and 114b2 to the motor commutation controller 130 as part of digital signals 127. As to be described below, based on digital signals 127, motor commutation controller 130 can set a commutation state of motor 120 and provide commutation state signal 181. Further, time measurement circuit 140 can measure a time elapsed between commutation state transitions to provide a speed estimate.

Comparator 121 has a first comparator input 121a (e.g., the positive (+) input), a reference input 121b (e.g., the negative (−) input), and a comparator output 121c. First comparator input 121a is coupled to output 118a of voltage processing circuit 116 to receive signal 120a representing a floating terminal voltage, and comparator input 121b is coupled to output 118b of voltage processing circuit 116 to receive signal 120b representing the neutral voltage $V_n$. Comparator 121 can provide a comparison signal 183 indicating whether the floating terminal voltage exceeds or is below the neutral voltage $V_n$. As to be described below, a state change of comparison signal 183 can indicate a zero crossing of a back EMF voltage, and time measurement circuit 140 can measure a time elapsed between consecutive zero crossings (represented by consecutive state change of comparison signal 183) to provide a speed estimate.

In the example of FIG. 1. ADC output 123b is coupled to the signal measurement input 131 of motor commutation controller 130. In another example, ADC 123 is part of motor commutation controller 130. Comparator output 121c is coupled to the first voltage transition input 132 of motor commutation controller 130 and to the first voltage transition input 141 of time measurement circuit 140. The first time measurement output 143 of time measurement circuit 140 is coupled to the first time measurement input 134 of motor commutation controller 130 and to the second time measurement input 151 of motor speed circuit 150. The second time measurement output 144 of time measurement circuit 140 is coupled to the third time measurement input 152 of motor speed circuit 152. The speed state output 153 of motor speed circuit 150 is coupled to the speed state input 133 of motor commutation controller 130.

Time measurement circuit 140 has the first voltage transition input 141, a commutation state input 142, a first time measurement output 143, and a second time measurement output 144. Time measurement circuit 140 includes counters 145 and 146 and a clock circuit 147. Counter 145 includes a counter control input 145a and a counter output 145b. Counter control input 145a is coupled to the first voltage transition input 141, and the counter output 145b is coupled to the first time measurement output 143. Similarly, counter 146 includes a counter control input 146a and a counter output 146b. Counter control input 146a is coupled to the commutation state input 142, and the counter output 146b is coupled to the second time measurement output 144. Both counters have a clock input coupled to the clock circuit 147. Clock circuit 147 produces a clock signal at any suitable frequency (e.g., 100 kHz, 500 kHz, etc.). Counter 145 counts pulses of the clock signal from clock circuit 147 while counter 145 is activated. A particular logic level (e.g., logic high) or edge (e.g., rising edge) of comparison signal 183 on the second voltage transition input 141, which represents a comparison result a floating terminal voltage and a neutral voltage $V_n$, can activate counter 145 to count pulses of the clock signal. Counter 145 outputs a count value at its counter output 145b which indicates the time while the counter was activated. Similarly, counter 146 measures time while counter 146 is activated, which can occur based on a particular logic level or edge of commutation state signal 181, which indicates an instantaneous commutation state or a commutation state transition.

Motor commutation controller 130 has a signal measurement input 131, a first voltage transition input 132, a speed state input 133, a first time measurement input 134, the commutation state output 135, and blank time output 136.

For example, motor commutation controller 130 can receive digital signals 127 representing the floating terminal voltage, the neutral voltage $V_n$, and the motor current I, at signal measurement input 131. Motor commutation controller 130 can receive comparator signal 183 at a first voltage transition input 132. Motor commutation controller 130 can also receive a speed state signal 185 at speed state input 133. Depending on the speed state indicated by speed state signal 185, motor commutation controller 130 can determine a commutation state of motor 102 based on different techniques. Specifically, in the example of FIG. 1, motor commutation controller 130 includes a look-up table (LUT) 137, described below, for mapping motor voltage and current to commutation state/rotor angle at relatively low rotor speeds. In a case where speed state signal 185 indicates a low speed state, motor commutation controller 130 can provide digital signals 127 to LUT 137 to determine an instantaneous commutation state or a commutation state transition of motor 102. In a case where speed state signal 185 indicates a medium or high speed state, motor commutation controller 130 can determine an instantaneous commutation state and/or a commutation state transition of motor 102, based on, for example, detecting a zero crossing of the back EMF voltage from comparator signal 183 and a time offset based on a time measurement signal from counter 145 (via first time measurement input 134). Motor commutation controller 130 can also provide a blanking signal 139 to indicate a blanking window (e.g., DeGauss window) from the commutation state transition, in which both motor commutation controller 130 and motor speed circuit 150 can ignore measurements of voltages of motor 102 and do not effectuate commutation state/speed state changes within the blanking window. For example, commutation state changes are disabled during each blanking window and are enabled after the blanking window.

Motor speed circuit 150 has a second time measurement input 151, a third time measurement input 152, a speed state output 153, a motor speed output 154, a blank time input 155, and a trigger input 156. As to be described below, motor speed circuit 150 can have multiple speed states, such as a low speed state, a medium speed state, and a high speed state, where each speed state is associated with a particular speed range of motor 102. For different speed states, motor speed circuit 150 can use different techniques in determining the instantaneous speed of motor 102, and depending on the instantaneous speed, can either stay in a particular speed state or transition to a different speed state. As to be described below, using different techniques to determine the speed in different speed states can improve the accuracy of speed estimate. Motor speed circuit 150 can also receive other signals, such as blanking signal 139 and a current measurement signal 187 (e.g., from inverter 114 via output 115), and determine the instantaneous speed and speed state based on these signals, as to be described below. Motor speed circuit 150 can provide speed state signal 185 at speed state output 153, and a speed measurement signal 189 at motor speed output 154.

In one example, motor 102 can be activated and have its speed controlled by a user activating the trigger control 170, which outputs a user input signal 171 to speed circuit 150. The trigger control 170 may be a finger-activated pull-trigger, a button, a knob, or other type of user-activated control input device. Motor speed circuit 150 can include a de-glitch circuit 157 that has a de-glitch input 158 and a de-glitch output 159. The de-glitch input 158 is coupled to the trigger input 156. De-glitch circuit 157 receives user input signal 171 from the trigger control 170 and produces an output signal at the de-glitch output 159 responsive to the control signal from the trigger control 170. De-glitch circuit 157 reduces noise on the control signal from the trigger control 170 to reduce the risk of the motor speed circuit 150 from changing the speed of the motor in response to such noise. In one example, de-glitch circuit 157 can be a low-pass filter. In some examples, de-glitch circuit 157 can provide the output signal to output 154 via de-glitch output 159 to the input 191*b* of PWM controller 190 as speed control signal 182*b*, which can set the duty cycle of the PWM signals based on, e.g., a magnitude of speed control signal 182*b*, so that motor speed circuit 150 can set the speed of motor 102 based on user input signal 171.

Also, in an example motor system that includes closed-loop speed controller 110 to provide closed-loop motor speed control, the speed controller includes a reference speed input 110*a*, a speed control input 110*b*, and a speed control output 110*c*. A reference speed signal is provided to the reference speed input 110*a*, and the motor speed output 154 of motor speed circuit 150 is coupled to the speed control input 110*b* of speed controller 110. The speed control output 110*c* of speed controller 110 is coupled to input 191*a* of PWM controller 190 to provide a speed control signal 182*a*. Closed-loop speed controller 110 can adjust speed control signal 182*a* to minimize/reduce a difference between an actual speed indicated by speed estimate signal 189 and a reference speed represented by the reference speed signal.

Any of the components of the illustrative motor system 100, other than motor 102, in the example of FIG. 1 can be fabricated as an integrated circuit (IC) on a semiconductor die. In one example, an IC can include comparator 121, ADC 123, motor commutation controller 130, time measurement circuit 140, and motor speed circuit 150. The IC can also include motor inverter driver 112. In another example, the IC can include speed controller 110 and/or inverter 114. In one example, motor commutation controller 130, time measurement circuit 140, and motor speed circuit 150 can be implemented by processor circuitry executing machine instructions. FIG. 14, described below, is an example schematic diagram of a processing platform that includes processor circuitry. In another example, motor commutation controller 130, time measurement circuit 140, and motor speed circuit 150 can be implemented as digital circuits fabricated on an IC.

In an example, the motor system 100 implements a trapezoidal motor control commutation technique in which the motor exhibits a trapezoidal back-electromotive-force (BEMF) waveform. Trapezoidal motor control can be used in multiple applications, such as fans, power tools, compressors, etc.

Figure 2A:
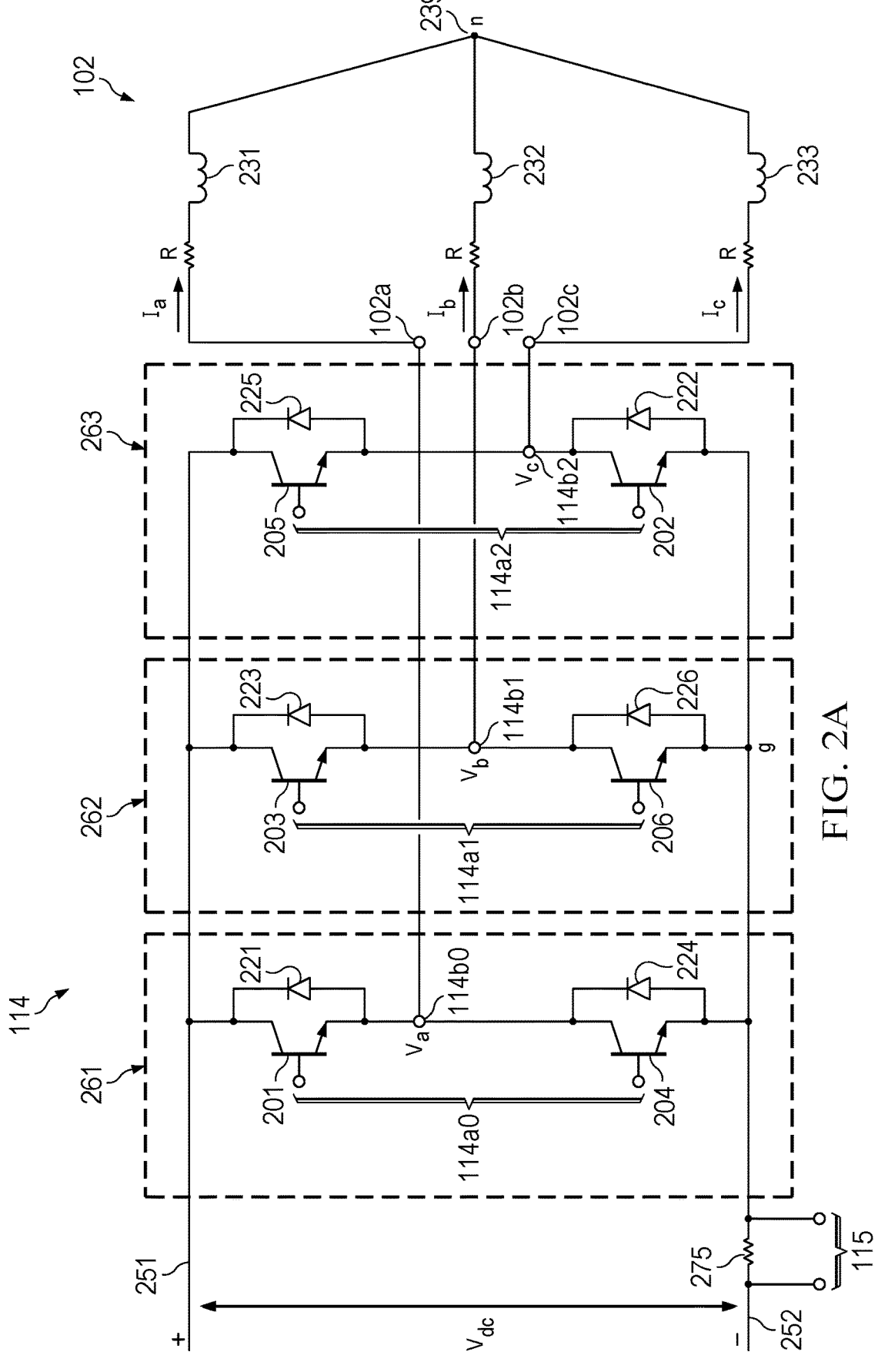
FIG. 2A is a schematic diagram of a motor driver inverter and motor in the motor system of FIG. 1, in an example.

FIG. 2A is a schematic diagram of the motor driver inverter 114 and motor 102, in an example. In this example, inverter 114 is a three-phase inverter and includes transistors 201, 202, 203, 204, 205, and 206. Each transistor can be a bipolar junction transistor (BJT) as shown, or a field effect transistor (FET), a laterally-diffused metal-oxide semiconductor (LDMOS) FET, a Gallium Nitride (GaN) FET, a silicon carbide (SiC) metal-oxide-semiconductor field effect transistor (MOSFET), etc. Each of transistor 201-206 may have a body diode. For example, in FIG. 2, transistors 201, 202, 203, 204, 205, and 206 have body diodes 221, 222, 223, 224, 225, and 226, respectively. Transistors 201-206 are arranged as three pairs of transistors, with each pair of transistors coupled in series between power supply terminals 251 and 252 as a half-bridge. A power supply voltage $V_{dc}$ is supplied between the power supply terminals 251 and 252. Transistors 201 and 204 are coupled in series (source of transistor 201 coupled to drain of transistor 204 between power supply terminals 251 and 252 to form a half-bridge 261 with output 114*b*0. Transistors 203 and 206 are coupled in series (source of transistor 203 coupled to drain of transistor 206) between power supply terminals 251 and 252 to form a half-bridge 262 with output 114*b*1. Transistors 205 and 202 are coupled in series (source of transistor 205 coupled to drain of transistor 202 between power supply terminals 251 and 252 to form a half-bridge 263 with output 114*b*2. Half-bridge 261 has input 114*a*0 including two separate signal lines coupled to respective control terminals of transistors 201 and 204. Half-bridge 262 has input 114*a*l including two separate signal lines coupled to respective control terminals of transistors 203 and 206. Half-bridge 263 has input 114*a*2 including two separate signal lines coupled to respective control terminals of transistors 205 and 202. The voltages at outputs 114*b*0, 114*b*1, and 114*b*2 are $V_a$, $V_b$, and $V_c$, respectively.

Motor driver inverter 114 may also have a sense resistor 275 (e.g., 100 milliohms) through which the motor's phase current flows. Sense resistor 275 may be coupled to current sense output 115 and input 123*a* of ADC 123. The voltage across sense resistor 275 is proportional to the motor's current. That voltage may be digitized by ADC 123 as digital value DIG 127 (FIG. 1) and provided to signal measurement input 131 of motor commutation controller 130.

Figure 2B:
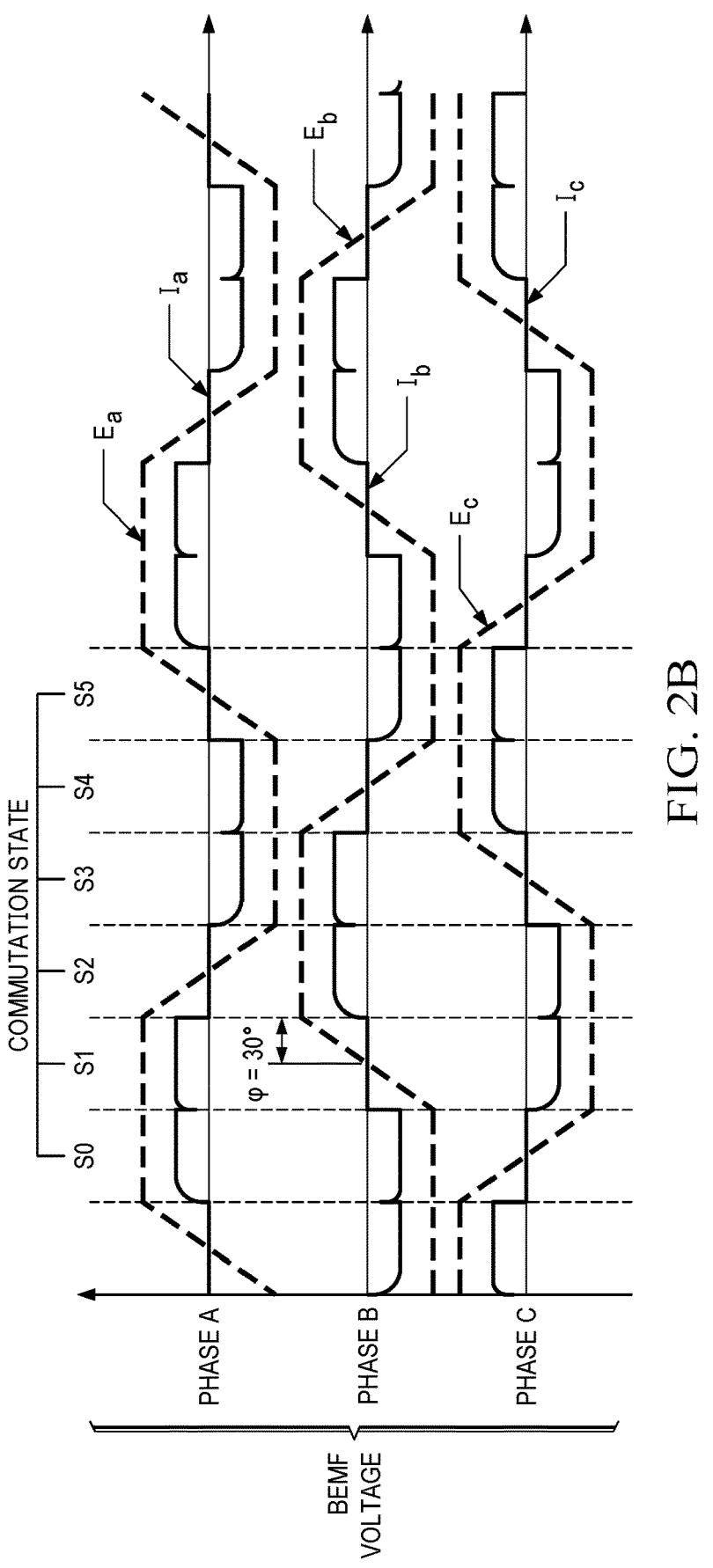
FIG. 2B includes graphs that illustrate operations of the motor driver inverter and motor, in an example.

FIG. 2B includes graphs representing an operation of motor 102 under the control of motor driver inverter 114. The motor operation can be divided into six states, S0 to S5, having switching intervals specified in Table 1 below. There are six back-EMF zero crossings per electrical rotation, one per state, as shown in FIG. 2B. In each state, two half bridges of the three-phase inverter 114 are active, where the control terminal of upper transistor of a first half-bridge is held high and the control terminal of lower transistor of the first half-bridge is held low, and the control terminal of upper transistor of a second half-bridge is held low and the control terminal of lower transistor of the second half-bridge is held high. Also, the output of the third half-bridge is in a floating state and disconnected from power supply terminals 251 and 252, where the control terminals of these transistors are held low.

For example, with reference to FIG. 2B, in commutation state S0, transistor 206 of half-bridge 262 is enabled, and transistor 203 of half-bridge 262 is disabled. Also, the control terminals of transistors 201 and 204 of half-bridge 261 are driven by PWM controller 190. This PWM signaling can be controlled by PWM controller 190, where the duty cycle of the PWM signals can set the amount of torque provided by the motor and the motor speed. Also, transistors 202 and 205 of half-bridge 263 are disabled, so that half-bridge 263 is in a floating state. This particular commutation state corresponds to a certain magnetic field direction. When the rotor has rotated enough, the motor needs to commutate and switch phases, so that a new magnetic field vector is generated to impel the rotor to continue to spin. Absent such commutation, i.e., absent continuous reconfiguration of the magnetic field, the rotor would align to the static magnetic field and stop, which is not the desired behavior of a motor commanded to supply a rotating torque to a load. The commutation states, which are a function of rotor angle, are summarized in Table 1. In the illustrated example of FIG. 2B, the S1 to S2 commutation occurs at commutation angle $\varphi=\pi/6$ radians past the zero crossing of phase B. Similarly, the S2 to S3 commutation occurs at commutation angle $\varphi=\pi/6$ radians past the zero crossing of phase A.

TABLE 1

Commutation state table illustrating the electrical angle range
for each state and the active transistors

| State | Switching Interval | Active Transistors |
|---|---|---|
| S0 | $-\dfrac{\pi}{6} - \varphi < \theta_e < \dfrac{\pi}{6} - \varphi$ | 201, 206 |
| S1 | $\dfrac{\pi}{6} - \varphi < \theta_e < \dfrac{\pi}{2} - \varphi$ | 201, 202 |
| S2 | $\dfrac{\pi}{2} - \varphi < \theta_e < \dfrac{5\pi}{6} - \varphi$ | 202, 203 |
| S3 | $\dfrac{5\pi}{6} - \varphi < \theta_e < \dfrac{7\pi}{6} - \varphi$ | 203, 204 |
| S4 | $\dfrac{7\pi}{6} - \varphi < \theta_e < \dfrac{9\pi}{6} - \varphi$ | 204, 205 |
| S5 | $\dfrac{9\pi}{6} - \varphi < \theta_e < \dfrac{11\pi}{6} - \varphi$ | 205, 206 |

As shown above, during each commutation state of the motor driver inverter 114, one pair of transistors across half-bridges 261, 262, and 263 is enabled, in which one transistor is enabled throughout a period of the PWM signal and the other transistor is enabled during part of the period based on the duty cycle. FIG. 2B illustrates the BEMF voltages $E_a$, $E_b$, and $E_c$ with respect to time across phases A, B, and C. $E_a$, $E_b$, and $E_c$ can each be trapezoidal.

As described above, motor system 100 implements a trapezoidal control technique. Trapezoidal control includes six commutation states of the motor—S0, S1, S2, S3, S4, and S5. During each of the six commutation states, the rotor turns 60 degrees and thus turns one complete electrical cycle for all six commutation states. During each commutation state, both transistors for one of the inverter's phases are off and a transistor in another phase is turned on and off in accordance with control signals from PWM controller 190, which have pulse width and/or duty cycle adjusted by motor inverter driver 112.

For example, during commutation state S0, transistors 203, 204, 205, and 202 are turned off, transistor 206 is turned on, and the control signal from PWM controller 190 is provided to the gate of transistor 201 to turn transistor 201 on and off in accordance with the PWM signal. When transistor 201 is on, current Ia flows through transistor 201, through windings 231 and 232, and through transistor 206. When transistor 201 is off in commutation state S0, current Ia continues to flow through the body diode 224 of transistor 204, through windings 231 and 232, and transistor 206.

During commutation state S1, transistors 203, 204, 205, and 206 are turned off, transistor 202 is turned on, and a PWM signal is provided to the gate of transistor 201 to turn transistor 201 on and off in accordance with the PWM signal. When transistor 201 is on, current Ia flows through transistor 201, through windings 231 and 233, and through transistor 202. When transistor 201 is off in commutation state S1, current Ia continues to flow through the body diode 224 of transistor 204 and through windings 231 and 233 and transistor 202.

During commutation state S2, transistors 201, 204, 205, and 206 are turned off, transistor 202 is turned on, and a PWM signal is provided to the gate of transistor 203 to turn transistor 203 on and off in accordance with the PWM signal. When transistor 203 is on, current Ic flows through transistor 203, through windings 232 and 233, and through transistor 202. When transistor 203 is off in commutation state S2, current Ic continues to flow through the body diode 226 of transistor 206 and through windings 232 and 233 and transistor 202.

During commutation state S3, transistors 201, 202, 205, and 206 are turned off, transistor 204 is turned on, and a PWM signal is provided to the gate of transistor 203 to turn transistor 203 on and off in accordance with the PWM signal. When transistor 203 is on, current Ib flows through transistor 203, through windings 232 and 231, and through transistor 204. When transistor 203 is off in commutation state S3, current Ic continues to flow through the body diode 226 of transistor 206 and through windings 232 and 231 and transistor 204.

During commutation state S4, transistors 201, 202, 203, and 206 are turned off, transistor 204 is turned on, and a PWM signal is provided to the gate of transistor 205 to turn transistor 205 on and off in accordance with the PWM signal. When transistor 205 is on, current Ia flows through transistor 205, through windings 233 and 231, and through transistor 205. When transistor 205 is off in commutation state S4, current Ia continues to flow through the body diode 222 of transistor 202 and through windings 233 and 231 and transistor 204.

During commutation state S5, transistors 201, 202, 203, and 204 are turned off, transistor 206 is turned on, and a PWM signal is provided to the gate of transistor 205 to turn transistor 205 on and off in accordance with the PWM signal. When transistor 205 is on, current Ic flows through transistor 205, through windings 233 and 232, and through transistor 206. When transistor 205 is off in commutation state S5, current Ic continues to flow through the body diode 222 of transistor 202 and through windings 233 and 232 and transistor 206.

The mathematical equations governing the computation of BEMF are shown in Equations 1 through 3, below.

$$V_a = R \cdot I_a + L\frac{dI_a}{dt} + E_a + V_n \tag{1}$$

$$V_b = R \cdot I_b + L\frac{dI_b}{dt} + E_b + V_n \tag{2}$$

$$V_c = R \cdot I_c + L\frac{dI_c}{dt} + E_c + V_n \tag{3}$$

where $V_a$, $V_b$, and $V_c$ are the voltages at inverter outputs 114b0, 114b1, and 114b2 of motor inverter 114, respectively, relative to ground, $V_n$ is the neutral voltage at node 239 with respect to ground. R is the series resistance of windings 231, 232, and 233 (FIG. 2) and L is the inductance of the windings 231, 232, and 233 (FIG. 2).

The voltages $V_a$, $V_b$, and $V_c$, currents $I_a$, $I_b$, and $I_c$, and BEMF voltages $E_a$, $E_b$, and $E_c$ are related according to Equations 1, 2, and 3. For example, during commutation state S0, the gates of transistors 202 and 205 are held low to drive the current $I_c$ to zero. Substituting $I_c=0$ in Equation 3 and assuming that the derivative of $I_c$ is zero, the measured voltage $V_c$ can be related to the BEMF voltage $E_c$ and neutral voltage $V_n$ according to Equation 4.

$$V_c = E_c + V_n \tag{4}$$

Accordingly, the BEMF voltage $E_c$ can be computed, for example by motor commutation controller 130 described below, based on $V_c$ and $V_n$. The neutral voltage $V_n$ can be obtained by making a neutral tap available and sensing the voltage. Alternatively, the neutral voltage can be estimated as follows, thereby eliminating the need for neutral access. Adding Equations 1, 2, and 3, and assuming a sinusoidal motor ($E_a + E_b + E_c = 0$), $$V_a + V_b + V_c = 3V_n \qquad (5)$$

Equations 4 and 5 can be used to estimate the neutral voltage $V_n$ and hence the BEMF signal $E_c$ during state S0 according to Equation 6 by, for example, motor commutation controller 130 (described below).

$$E_c = V_c - V_n = V_c - (V_a + V_b + V_c)/3 \qquad (6)$$

As described above, voltage processing circuit 116 can provide signal 120a representing a floating terminal voltage and signal 120b representing the neutral voltage $V_n$. The floating terminal voltage can be a voltage between one of outputs 11460 ($V_a$), 114b1 ($V_b$), or 114b2 ($V_c$) that is floating due to both transistors of the half-bridge being disabled and the half-bridge is in a floating/disabled state, and node 239. In a case where half-bridge 261 is in the floating state the floating terminal voltage can be $V_{an}$ ($V_{an} = V_a - V_n$). In a case where half-bridge 262 is in the floating state, the floating terminal voltage can be $V_{bn}$ ($V_{bn} = V_b - V_n$). And in a case where half-bridge 263 is in the floating state, the floating terminal voltage is $V_{cn}$ ($V_{cn} = V_c - V_n$). As explained above, the commutation state of motor 102 determines which half-bridge is floating. Accordingly, voltage processing circuit 116 can provide signal 120a representing floating terminal voltage based on one of $V_a$, $V_b$, or $V_c$ based on the commutation state (indicated by commutation state signal 181). Also, voltage processing circuit 116 can provide signal 120b representing the neutral voltage $V_n$ based on $V_a$, $V_n$, and $V_c$ as shown in the Equations above.

Figure 2C:
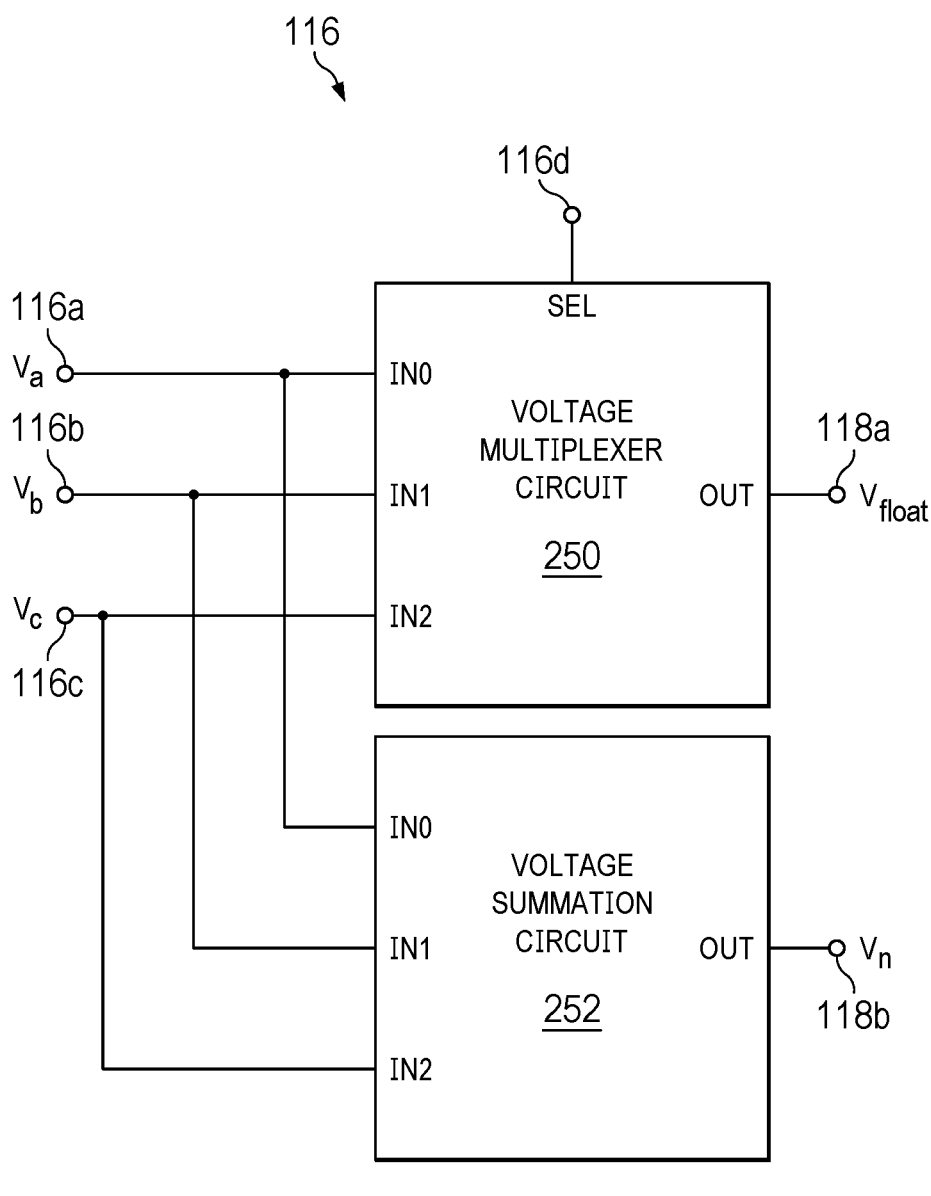
FIG. 2C is a schematic diagram of a component of a motor system, in an example.

FIG. 2C is a schematic illustrating examples of internal components of voltage processing circuit 116. As shown in FIG. 2C, voltage processing circuit 116 includes a voltage multiplexer circuit 250 and a voltage summation circuit 252. Voltage multiplexer circuit 250 includes voltage inputs coupled to inputs 116a, 116b, and 116c to receive $V_a$, $V_b$, and $V_c$, respectively. Voltage multiplexer circuit 250 also has a selection input (SEL) coupled to control input 116d to receive commutation state signal 181. Based on the commutation state, voltage multiplexer circuit 250 can forward one of $V_a$, $V_b$, or $V_c$ as the floating terminal voltage $V_{float}$. Further, voltage summation circuit 252 has inputs coupled to inputs 116a, 116b, and 116c to receive $V_a$, $V_b$, and $V_c$, respectively, and provide the neutral voltage $V_n$ as an average of $V_a$, $V_b$, and $V_c$ according to the Equations above. In some examples, voltage summation circuit 252 may include a summing amplifier to perform the voltage summation and averaging. To support the determination of commutation state and motor speed, ADC 123 can then convert $V_{float}$ and $V_n$ into digital signals 127, and comparator 121 can generate comparison signal 183 by comparing between $V_{float}$ and $V_n$, as to be described below.

In some examples, motor commutation controller 130 can also receive sampled versions of $V_a$, $V_b$, and $V_c$ (via input 131) from ADC 123 and generate a digital version of $V_n$. Motor commutation controller 130 generates a digital representation of the floating terminal voltage $V_{float}$ based on $V_a$, $V_b$, and $V_c$ and the current commutation state indicated by commutation state. The motor commutation controller can then provide the selected candidate floating terminal voltage with respect to computed neutral voltage to LUT 137 to determine the updated commutation state or the commutation state transition of motor 102, as to be described below.

Equations 7 and 8 below represent additional voltage equations in inverter 114. Equations 7 and 8 assume half-bridge 263 is in a floating state, and half-bridges 261 and 262 are actively driven during state S0, but the equations apply to any of the commutation states by determining the appropriate active and floating phase subscripts for each state. Equations 7 and 8 are valid even for trapezoidal back-EMF salient motors.

$$V_{cn} = I_c R_s + \left(L_0 - L_2 \cos 2\left(\theta_r - \frac{\pi}{3}\right)\right)\frac{dI_c}{dt} + \qquad (7)$$
$$\sqrt{3}\, L_2 \left\{I_a * 2 * \cos\left(2\theta_r + \frac{\pi}{3}\right) * \omega_r + \sin\left(2\theta_r + \frac{\pi}{3}\right) * \frac{dI_a}{dt}\right\} +$$
$$\omega_r * \lambda_m F\left(\theta_r + \frac{2\pi}{3}\right)$$

$$V_{ab} = I_a * 2R_s + \left(3L_0 - 3L_2 \cos 2\left(\theta_r - \frac{\pi}{3}\right)\right)\frac{dI_a}{dt} + \qquad (8)$$
$$3L_2\left\{I_a * \sin\left(2\theta_r + \frac{\pi}{3}\right) * 2\omega_r\right\} + \omega_r * \lambda_m \left\{F(\theta_r) - F\left(\theta_r - \frac{2\pi}{3}\right)\right\}$$

The symbols used in Equations 7 and 8 are summarized in Table 1.

TABLE 1

| Symbols and Notations | | |
|---|---|---|
| Variable/Symbol | Description | SI Units |
| $R_s$ | Stator phase resistance | $\Omega$ |
| $L_d, L_q$ | d-axis and q-axis inductance, respectively | H |
| $L_0$ | $(L_d + L_q)/3$ | H |
| $L_2$ | $(L_q - L_d)/3$ | H |
| $\lambda_m$ | Back-EMF constant | V · sec/radian |
| $\omega_r$ | Rotor electrical frequency | radians/second |
| $\theta_r$ | Rotor electrical angle | radian |
| $V_{ab}$ | Voltages applied across A-B | V |
| $V_{cn}$ | Voltage between phase C and neutral | V |
| $V_a, V_b, V_c$ | Phase voltage with respect to ground | V |
| $I_a, I_b, I_c$ | Phase current | A |
| $\varphi$ | Commutation angle | radian |
| $F(\theta_r)$ | Trapezoidal function | unitless |

The floating terminal voltage $V_{cn}$ contains rotor position information as the summation of two key terms: (a) the mutual inductance term (the third term of Equation 7, i.e., the term beginning with $\sqrt{3}$) and (b) the BEMF term (the fourth term of Equation 7, i.e., the term beginning with $\omega_r$). When the half-bridge 263 is in a high impedance state, $I_c \approx 0$, the first two terms of Equation 7 are negligible. Permanent magnet motors exhibit saliency ($L_2 \neq 0$) because of a difference between the d and q axes inductances. The position-dependent mutual inductance term $\sqrt{3}L_2 \sin (2\theta_r + \pi/3)*(dI_a/dt)$ is present even at zero and low speeds when the back-EMF term $\omega_r * \lambda_m F(\theta_r + 2\pi/3)$ is negligible. The mutual inductance term is a high-frequency term present due to the high frequency PWM switching current with harmonic content near the PWM carrier frequency. The BEMF term is a low-frequency term with harmonic content near the motor electrical frequency. This separation of the BEMF and mutual inductance voltage terms in the frequency spectrum can be exploited by having high-frequency and low-frequency signal paths. The extraction of the low-frequency and high-frequency components can be achieved via analog or digital filtering (e.g., filters implemented as part of ADC 123).

The time rate of change in current $dI_a/dt$ in the mutual inductance term in Equation 7 can be determined implicitly from Equation 8, because $V_{ab}$ is equal to the power supply voltage ($V_{dc}$ in FIG. 2). Accordingly, the left-hand side of Equation 8, $V_{ab}$, is known to the estimator because it is what is being driven. For example, multiple samples of total current $I_{tot}$ (the current through sense resistor 275) can be sampled in a control signal cycle to aid the estimate of current slope.

Accordingly, the effect of variation of inductance on current level can be captured. For example, a lookup table (e.g., LUT 137) can store the different commutation voltages as a function of current. In one example, to generate the lookup table, motor 102 can be spun and a sensor can be used to record the voltages and currents at different commutation instances. The voltages and currents can be stored in a lookup table for the various commutation states S0-S5. The inductance $L_2$ for different levels of current $I_{tot}$ then being known, and $I_a$ and $dI_a/dt$ having been determined, $\sin(2\theta_r + \pi/3)$ can be estimated at low speeds (e.g., by motor commutation controller 130) as $V_{cn}/(\sqrt{3} \cdot L_2 dI_a/dt)$, resulting in an estimate of rotor electrical angle $\theta_r$. In one example, LUT 137 can be user-programmable. In another example, motor commutation controller can be programmed (e.g., preprogrammed) with lookup tables for a variety of different BLDC motors, and the appropriate lookup table can be user-selected at the time of motor-controller integration.

Alternatively, rather than estimating rotor electrical angle $\theta_r$, motor commutation controller 130 can be configured to estimate the voltage at which a commutation event happens, a commutation event being a transition between one of the states S0, S1, etc. In such an alternative, a motor can be driven to known rotor electrical angles $\theta_r$, and all of the commutation voltages can be recorded and saved to a lookup table later used by the estimator. Again, such a lookup table can be programmed by an end user (i.e., the motor-controller integrator) or can be end-user-selectable from among a variety of available lookup tables at the time of motor-controller integration.

As described above, motor system 100 provides closed-loop control through the full range of motor speeds from idle to $\omega_{max}$. In an example, motor speed circuit 150 has an IDLE state, an Initial Position Detect Six Step (IPD_SS) state, and a RUN state. In the IDLE state, motor 102 is not spinning. In the IPD_SS state, motor 102 also is not spinning but a signal has been generated to request the motor to spin. For example, a signal may have been generated by trigger control 170 and provided to motor speed circuit 150. Responsive to the trigger control signal, motor speed circuit 150 can cause motor commutation controller 130 to determine the initial position of the rotor, and PWM controller 190 can select the correct pair of transistors to enable and to provide the PWM signal. Then in the RUN state, PWM controller 190 sets the duty cycle of the PWM signal to set the speed of the motor.

Figure 3:
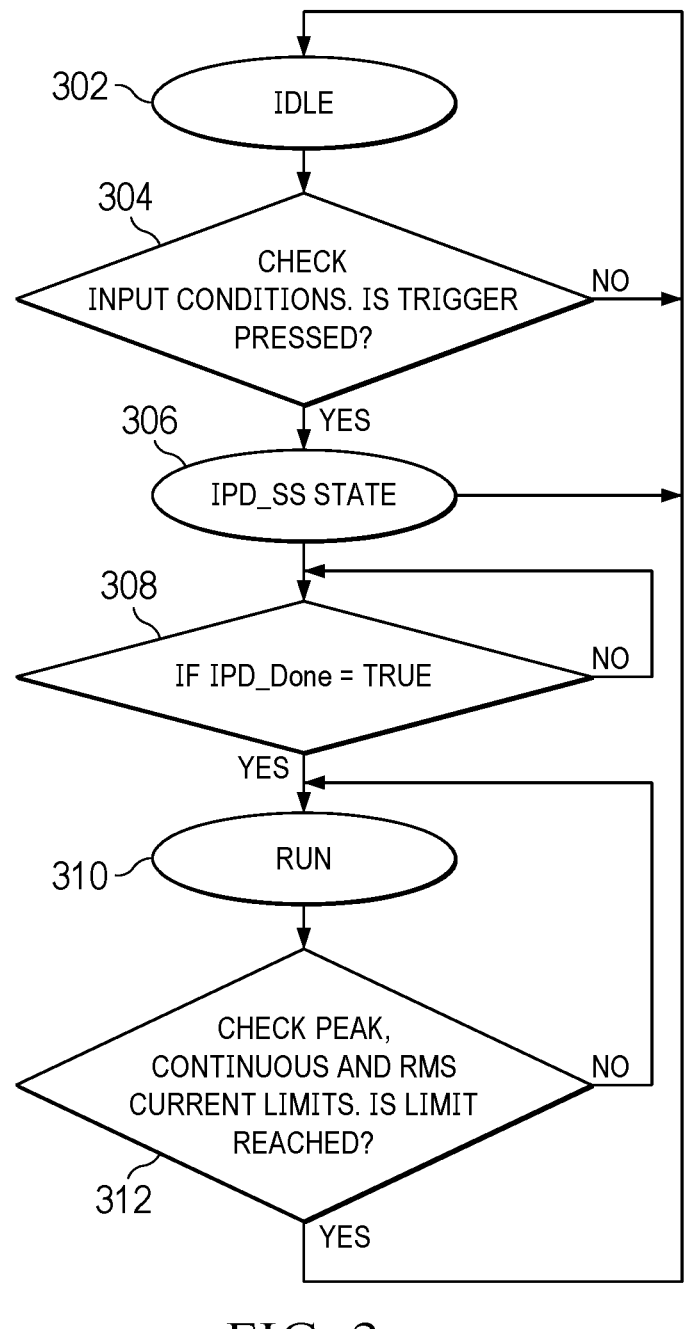
FIG. 3 is a flowchart illustrating states of operations of a motor system, in an example.

FIG. 3 is a flowchart illustrating example states of operations of motor system 100 (and motor speed circuit 150).

Referring to FIG. 3, motor speed circuit 150 can operate in one of an IDLE state 302, an IPD_SS state 306, and an RUN state 310. FIG. 3 also illustrates events/condition that cause a transition between the states. From the IDLE state, if at block 304, the trigger control 170 is activated, motor speed circuit 150 transitions to the IPD_SS state. In the IPD_SS state 306, motor 102 is still not spinning but motor speed circuit 150 can determine the position of the rotor relative to the stator. If IPD_DONE is "true" at decision block 308, which indicates that the initial position of the rotor has been determined, then motor speed circuit 150 transitions from the IPD_SS state to the RUN state (block 310). Otherwise, if IPD_DONE is not TRUE, then motor speed circuit 150 remains in the IPD_SS state.

Motor speed circuit 150 controls the speed of motor 102 in the RUN state 310 in accordance with a target speed, which can be either $\omega_{ref}$ provided to speed controller 110 or a user input signal 171 from trigger control 170. During the RUN state 310, motor system 100 determines at decision block 312 whether the motor's current has exceeded an upper limit. In an example, motor speed circuit 150 receives current measurement signal 817, or digital values 127 from ADC 123 representing the motor current, and determines whether that motor current has exceeded the upper limit. The motor's current can be any of the peak motor current, the continuous current, and/or the root mean square (RMS) current. Motor speed circuit 150 can determine whether the motor's current has reached the upper limit and, if so, can cease the RUN state 310, and transition back to the IDLE state 302.

Within RUN state 310, motor speed circuit 150 can operate in one of multiple speed states. Each speed state can be associated with a range of instantaneous motor speeds. Depending on the speed state, motor speed circuit 150 can determine the instantaneous motor speed using different techniques. Also, motor commutation controller 130 can determine the commutation state using different techniques depending on the speed state.

Figure 4:
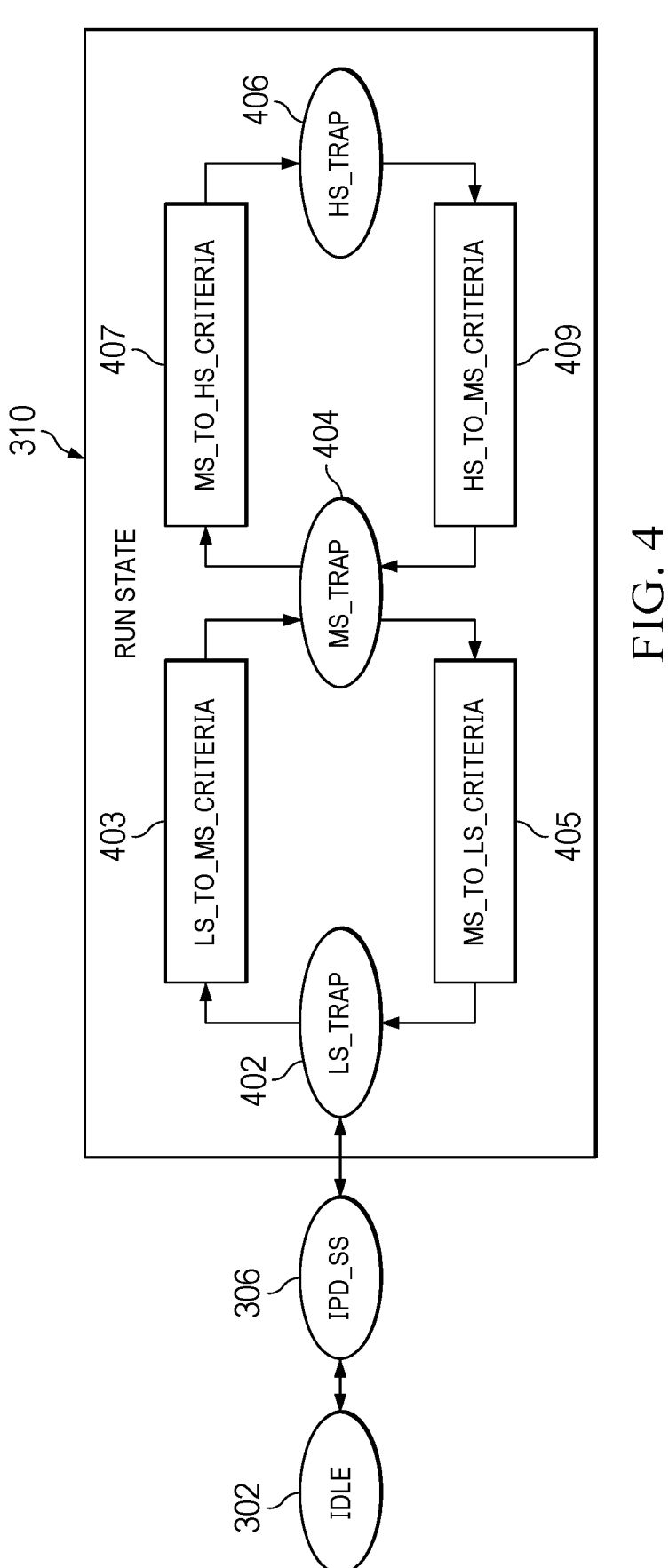
FIG. 4 is a flowchart illustrating speed states of a motor system, in an example.

FIG. 4 is a flowchart illustrating example speed states of the RUN state 310. In an example, motor speed circuit 150 includes three speed states for trapezoidal control collectively covering the full range of speeds for motor system 100 from idle to $\omega_{max}$. The three speed states include a lower speed trapezoidal state (LS_TRAP) 402, a medium speed trapezoidal state (MS TRAP) 404, and a higher speed trapezoidal state (HS TRAP) 406. The LS_TRAP state 402 corresponds to motor speeds in a first range. The HS_TRAP state 406 corresponds to motor speeds in a second range (up to $\omega_{max}$). The MS_TRAP state 404 corresponds to motor speeds in a third range. The second range is higher than the first range. The third range is between the first and second ranges. As described below, in each of the LS_TRAP state 402, MS_TRAP state 404, and HS_TRAP state 406, motor commutation controller 130 determines when to change the commutation state for inverter 114 based on speed state-specific criteria.

As the motor begins to turn, entry into the RUN state 310 from the IPD_SS state 306 is into the LS_TRAP state 402. In response to an LS_TO_MS_CRITERIA 403 being met, motor speed circuit 150 transitions from the LS_TRAP state 402 to the MS_TRAP state 404. From the MS_TRAP state 404, if the motor's speed is decreasing and motor speed circuit 150 determines an MS_TO_LS_CRITERIA 405 has been met, motor speed circuit 150 may transition back to the LS_TRAP state 402. However, if the motor's speed is increasing and motor speed circuit 150 determines an MS_TO_HS_CRITERIA 407 has been met, then motor speed circuit 150 transitions from the MS_TRAP state 404 to the HS_TRAP state 406. Once in the HS_TRAP state 406, motor circuit 150 can transition back to the MS_TRAP state 404 if the motor's speed decreases as determined by motor speed circuit 150 determining that an HS_TO_MS_CRITE-RIA 409 has been met. An example of criteria 403, 305, 407, and 409 are described below with reference to FIGS. 9-11.

Motor speed circuit 150 provides an indication of the speed state (LS_TRAP state 402, MS_TRAP state 404, and HS_TRAP state 406) at its speed state output 153 to motor commutation controller 130. In one example, motor speed circuit 150 outputs a two-bit binary value to indicate the speed state. Motor commutation controller 130 can use the speed state provided by speed circuit 150 to determine, as described below, when to change the commutation state of inverter 114 (e.g., from S0 to S1, from S1 to S2, and so on).

In some examples, motor 102 can rotate in either direction (e.g., clockwise or counterclockwise). For example, if the motor is rotating in one direction, the value of speed may be a positive quantity but for rotation in the opposite direction, the value of speed may be a negative quantity. References to motor or rotor speed in this description refers to the magnitude (absolute value) of the speed without regard to direction.

Figure 5:
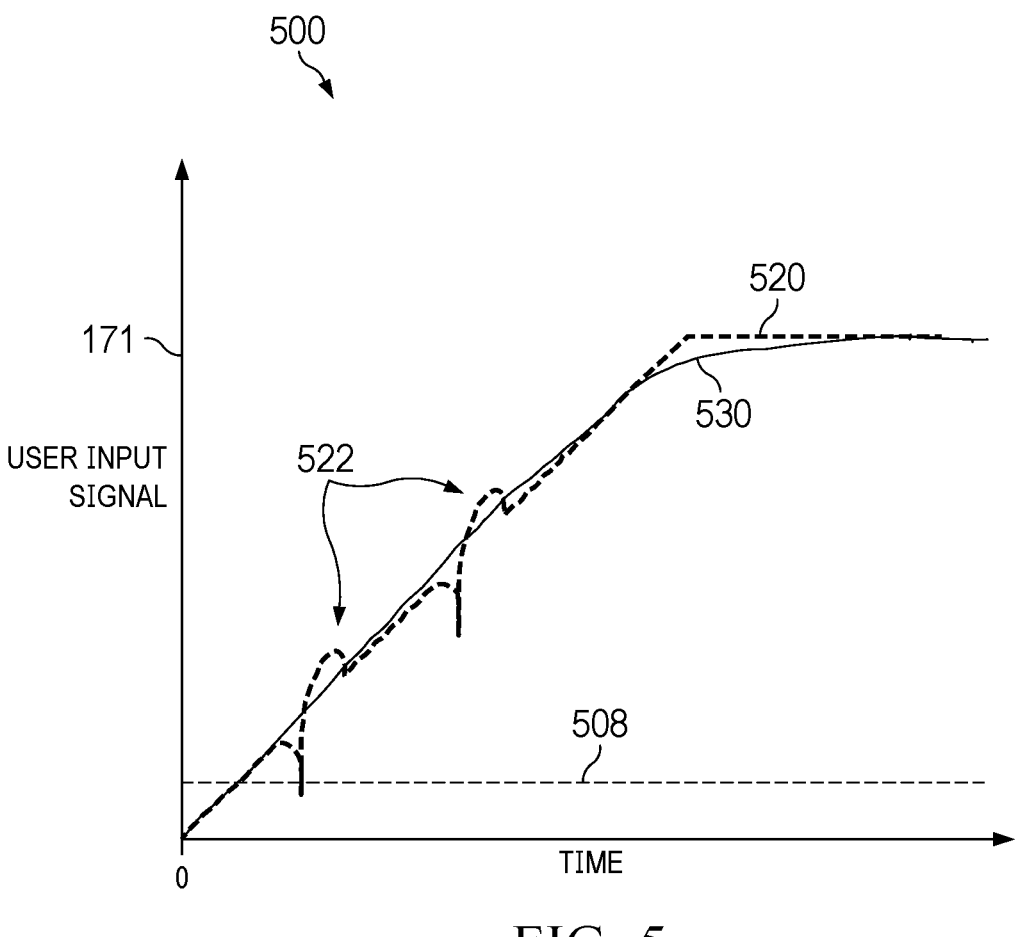
FIG. 5 is a graph illustrating an user input signal to a motor system, in an example.

FIG. 5 is a graph of user input signal 171 versus time as a user begins to activate trigger control 170. As the user activates trigger control 170, user input signal 171 can increase from a low value at time 0 to a steady state value 520. Motor speed circuit 150 detects when the magnitude of the user input signal 171 exceeds a threshold 508. Upon detecting that the user input signal 171 has reached the threshold 508, motor speed circuit 150 transitions from the IPD_SS state 306 to the RUN state 310. However, due to noise within trigger control 170, the user signal input 171 may experience glitches 522. To motor speed circuit 150 from controlling the motor's speed based on the glitches 522, the de-glitch circuit 157 filters out the glitches to produce a speed control signal 530 at de-glitch output 159 that generally follows user input signal 171 but without the glitches 522.

As described above, motor commutation controller 130 changes the commutation state of inverter 114 through six commutation states-S0 through S5. Accordingly, each commutation state accounts for 60 degrees of rotor rotation. In a sensorless motor system, such as motor system 100, measured motor phase voltages can be used to estimate the angular position of the rotor. The estimated angular position can be used by motor commutation controller 130 to determine the commutation state. The technique implemented by motor commutation controller 130 to determine the commutation state depends on the speed state (LS_TRAP state 402, MS_TRAP state 404, or HS_TRAP state 406) of motor speed circuit 150.

Figure 13:
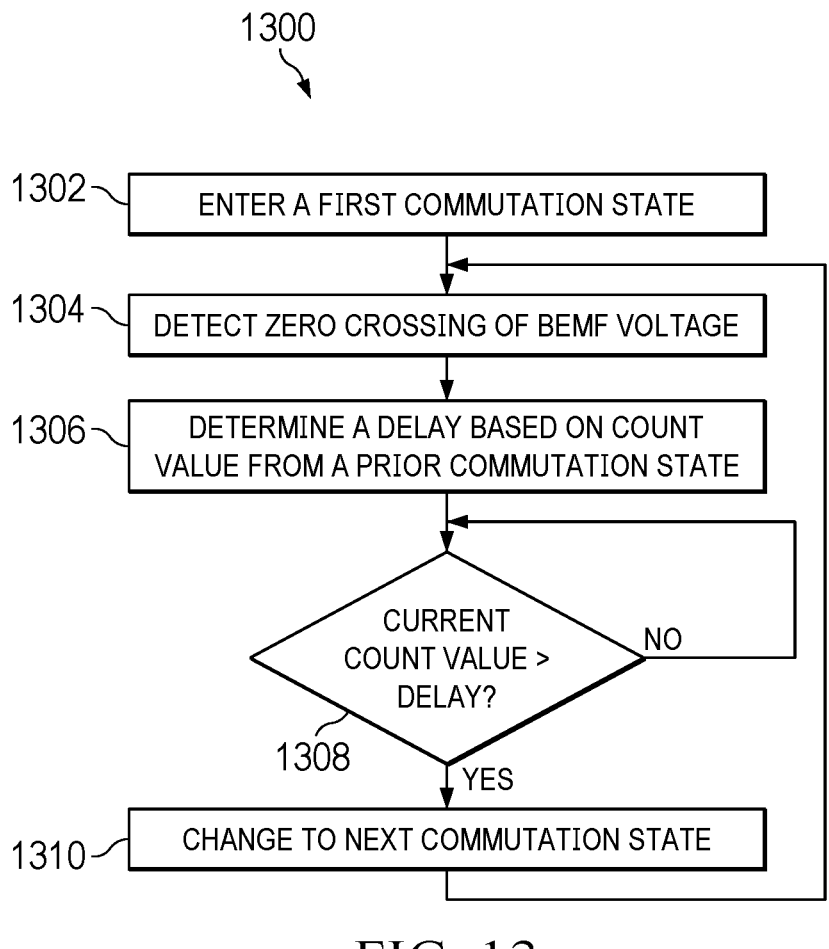
FIG. 13 is a flowchart of a method for transitioning between different commutation states of a motor system, in an example.

In the MS_TRAP and HS_TRAP states 404 and 406, respectively, the BEMF voltages $E_a$, $E_b$ and $E_c$ are relatively high and dominates the floating terminal voltage, and the zero-crossing of the floating terminal voltage ($V_{an}/V_{bn}/V_{cn}$) can be accurately measured. Comparator 121 can detect when the BEMF signals cross zero volts (the zero crossing of the BEMF signals) by comparing a floating terminal voltage $V_{float}$ (one of $V_a$, $V_b$, $V_c$) with the neutral voltage $V_n$, and changes in the logic state of its comparison signal 183 at the comparator output 121c can indicate a zero crossing. Counter 145 within time measurement circuit 140 can measure the elapsed time between successive zero crossings to provide an estimation of the motor speed. Further, motor commutation controller 130 can estimate when to change the commutation state in the MS_TRAP and HS_TRAP states 404 and 406 based on an offset with respect to the zero-crossing that corresponds to the desired commutation angle φ, where the offset is based on the estimated speed. The flowchart of FIG. 13 is an example method for determining when to change the commutation state of inverter 114 during the MS_TRAP and HS_TRAP states 404 and 406.

The output signal from comparator 121 is provided to the first voltage transition input 132 of motor commutation controller 130. The zero crossing-based count value from time measurement circuit 140 is provided to the first time measurement input 134 of motor commutation controller 130. Motor controller 130 determines when to change the commutation state of inverter 114 during the MS_TRAP state 404 and the HS_TRAP state 406 based on detection of the zero crossings of the BEMF signal and the zero-crossing-based count value. In one example, a zero crossing of a BEMF signal occurs during each commutation state. Motor commutation controller 130 applies a delay following each detected zero crossing to determine when to change the commutation state. The applied delay can be a function of motor speed—a faster motor speed means a smaller delay, and a slower motor speed means a longer delay. The relationship between motor speed and delay can be pre-programmed or otherwise configured into motor commutation controller 130. In one example, motor commutation controller 130 determines motor speed based on the zero crossing-based count value provided by counter 145 and then applies an appropriate delay to the zero crossing detection signal received at the first voltage transition input 132. In another example, motor commutation controller 130 determines the delay based on the zero-crossing count value (which is a function of motor speed).

Estimating speed and when to change the commutation state of inverter 114 based on zero crossings of the BEMF voltage works well at higher speeds, e.g., in the MS_TRAP and HS_TRAP states 404 and 406, respectively, because the magnitude of the BEMF voltages is sufficiently large. However, the magnitude of the BEMF voltages $E_a$, $E_b$, and $E_c$ is proportional to rotor speed. At lower speeds, e.g., during motor startup and transition from the IDLE state 302 to the LS_TRAP state 402, the BEMF voltage is small or zero and may not provide reliable rotor position information for adequate commutation.

Accordingly, at the lower speed state (e.g., LS_TRAP state 402), a different approach is employed by motor system 100. In an example, motor speed circuit 150 can provide low-speed speed estimation and motor commutation controller 130 can provide motor commutation by exploiting the position dependence of motor inductance. This behavior is due to the fact that the PWM current transient results in a mutual inductance component of the total voltage even at zero speeds. As described above, at lower speed, motor commutation controller 130 can receive digital signals 127 representing measurements of the commutation voltages, use LUT 137 to determine a commutation state, and provide commutation state signal 181. The commutation state signal 181 is also provided to counter control input 146a of counter 146. Counter 146 counts pulses of the clock signal from clock generator 147 to measure the elapsed time associated with each commutation state. Accordingly, the count value generated by counter 146 at its counter output 146b indicates the elapsed time of each commutation state. During the LS_TRAP state 402, motor speed circuit 150 estimates motor speed based on the count value from counter 146.

Figure 6:
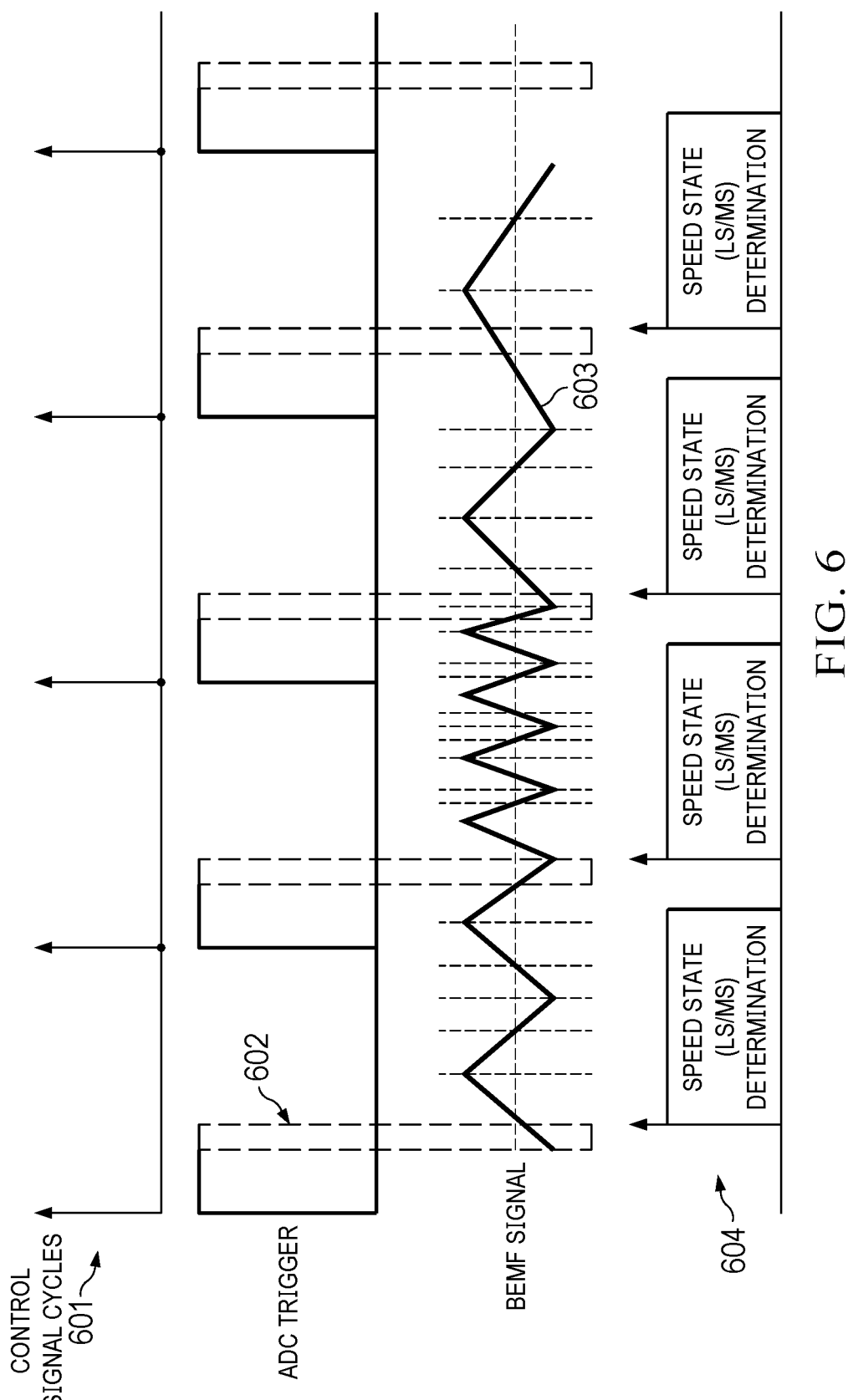
FIG. 6 includes graphs illustrating speed determination operations during low speed and medium speed states, in an example.

FIG. 6 is a timing diagram illustrating speed determination during the LS_TRAP state 402 and the MS_TRAP state 404. FIG. 6 includes control signal cycles 601 initiated by the PWM controller 190. Each control signal cycle triggers ADC 123 to take a sample 602 of the BEMF signal 603 and digitize the sample. During the LS_TRAP state 402, as described above, motor commutation controller 130 uses LUT 137 to determine when to change the commutation state of inverter 114 based on the digitized sample of the BEMF signal. Based on the commutation signal 181, counter 146 within time measurement circuit 140 can generate an elapsed time associated with the changes in commutation state (604) motor speed, and motor speed circuit 150 can determine an estimate of motor speed based on the output count value from counter 146.

Figure 7:
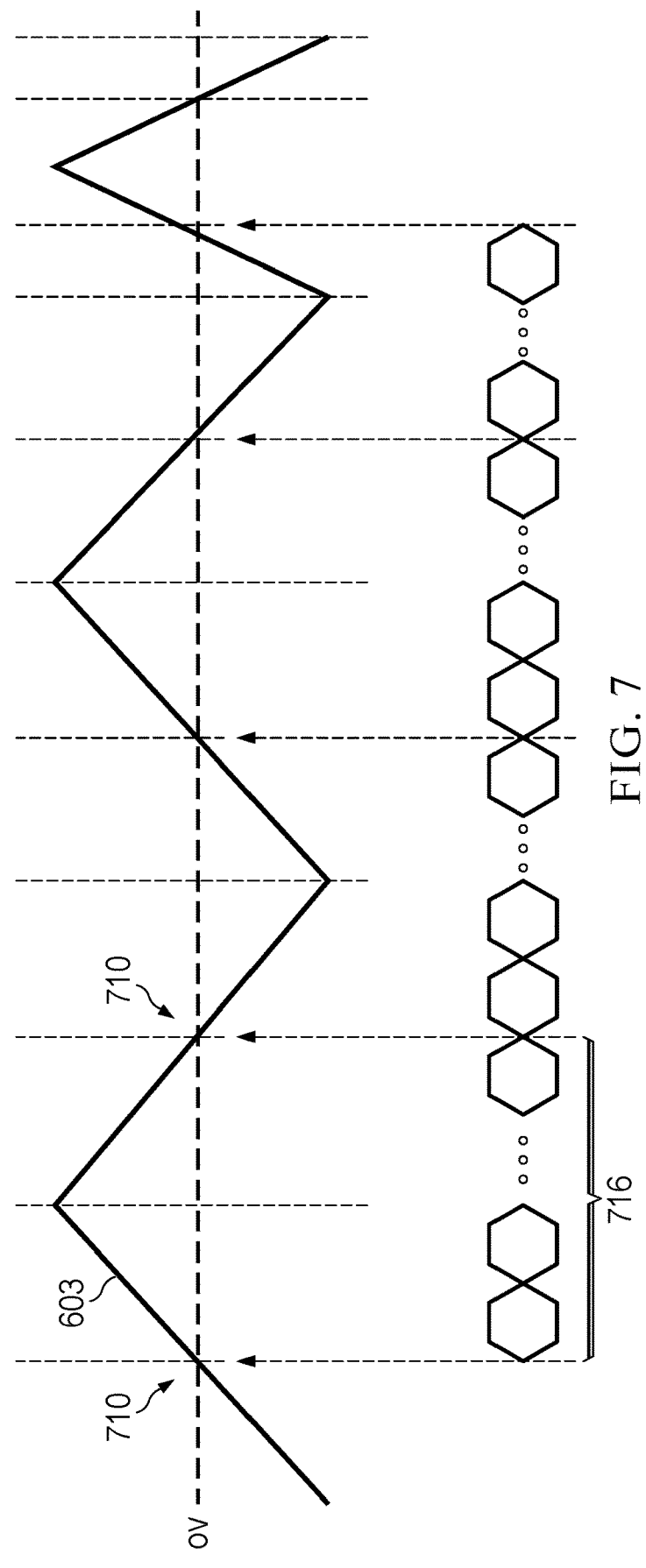
FIG. 7 includes graphs illustrating an example of BEMF voltage and time measurements of zero crossings of the BEMF voltage, in an example.

FIG. 7 is a timing diagram illustrating an example BEMF signal 603. Counter 145 counts pulses of the clock signal from clock circuit 147 and increments it count output 716 with each subsequent pulse of the clock signal to measure the elapsed time between successive zero crossings 710. Accordingly, the motor speed circuit 150 estimates motor speed based on the zero crossings of the BEMF signals.

Figure 8:
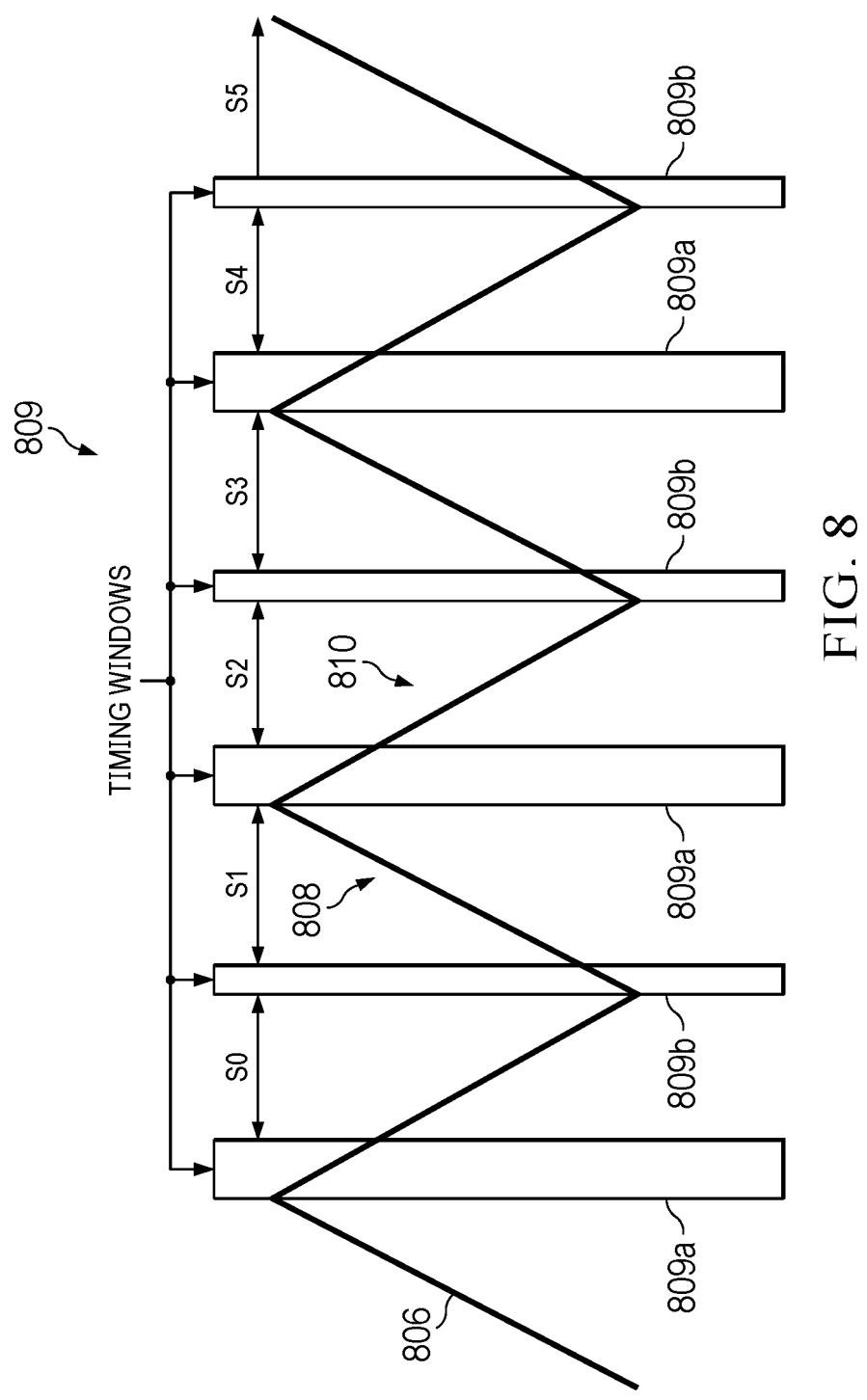
FIG. 8 includes graphs illustrating an example of a BEMF voltage and blanking windows across commutation states, in an example.

FIG. 8 is an example of a waveform 806 of a BEMF signal across commutation states S0 through S5. As motor commutation controller 130 changes the commutation state (e.g., from S0 to S1, S1 to S2, and so forth), the slope of the BEMF signal changes from a positive slope 808 to a negative slope 810. The changes in commutation state also define the beginning of timing windows 809 (also referred to as "De-Gauss" windows). To transition inverter 114 from one commutation state to the next, at least one transistor 201-206 is turned on and at least one transistor 201-206 is turned off. A transistor takes a finite amount of time to turn on or off. During each timing window 209, the on and off states of at least some of transistors 201-206 are changing. During each such timing window 209, in some examples, the BEMF signal should not be used to determine when to change commutation state and/or estimate motor speed. Motor commutation controller 130 asserts a blanking signal 139 at its blank time output 136. Motor speed circuit 150 receives the blanking signal 139 at its blank time input 155 and responds to an assertion of the blanking signal 139 by withholding a transition from one speed state to another within the timing window. For example, motor speed circuit 150 may not transition from the LS_TRAP state 402 to the MS_TRAP state 404 during a timing window 809.

The size (length of time) of some timing windows may be longer than for other timing windows. In the example of FIG. 8, timing windows 809 include timing windows 809a and 809b. Timing windows 809a are longer than timing windows 809b. The longer timing windows 809a occur at the transitions between commutation states S5 and S0, S1 and S2, and S3 and S4, while the shorter timing windows 809b occur at the transitions between commutation states S0 and S1, S2 and S3, and S4 and S5. Timing windows 809a may be larger than timing windows 809b due to, for example, a parasitic capacitance (e.g., parasitic capacitance between drain and source of a transistor) of some transistors taking longer to charge or discharge than other transistors. Further, the length of the timing windows 809 may be a function of motor current. Accordingly, motor commutation controller 130 can adjust the length of the timing windows based on a current measurement at the signal measurement input 131 from ADC 123. The current is the current through sense resistor 275. The current is digitized by ADC 123 and provided to the motor commutation controller's signal measurement input 131.

As described above, during the LS_TRAP state 402 and MS_TRAP states 404, motor speed circuit 150 determines motor speed based on the count value from counter 146. Counter 146 measures the elapsed time associated with the transitions of commutation states.

In one example, counter 146 can measure the elapsed time through the course of all six commutation states. For example, counter 146 may initiate its count at the beginning of commutation state S0 and output its count value to motor speed circuit 150 at the end of commutation state S5. During that time period, motor 102 rotates one full cycle, and motor speed circuit 150 can estimate motor speed based on the time the motor takes to rotate one full electrical cycle (360 degrees electrical). Motor speed circuit 150 can derive the time during which the motor rotates 60 degrees (and go through one commutation state) by dividing the total elapsed time for all six commutation states by 6.

In some examples, counter 146 may count the time elapsed between each commutation state (60 degrees), or between a number of commutation states (e.g., 2 commutation states or 120 degrees) to provide the speed estimates. Generating a speed state based on a time count on a fewer number of commutation states allows more responsive tracking of changes in motor speed (e.g., due to changes in loading, torque, etc.) but can be susceptible to noise.

For example, counter 146 can measure the elapsed time through the course of two commutation states. For example, counter 146 may initiate its count at the beginning of commutation state S0 and output its count value to motor speed circuit 150 at the end of commutation state S1. Counter 146 may provide similar count values based on the elapsed time across commutation states S2 and S3 and across commutation states S4 and S5. Motor speed circuit 150 can determine the total elapsed time for one full cycle of motor 102 by, for example, adding together the three consecutive count values or by averaging the three count values together and multiplying by 3. Motor speed circuit 150 can derive the time during which the motor rotates 60 degrees by dividing the time elapsed time for a consecutive commutation states by 2, or by dividing the full cycle elapsed time determined as described above by 6.

In yet another example, counter 146 can measure the elapsed time through the course of each respective commutation state. For example, counter 146 may initiate its count at the beginning of commutation state S0 and output its count value to motor speed circuit 150 at the end of commutation state S0. Counter 146 may provide similar count values based on the elapsed time through each of commutation states S2-S5. Motor speed circuit 150 can determine the total elapsed time for one full cycle of motor 102 by, for example, adding together the six consecutive count values or by averaging the six consecutive count values together and multiplying by 6. Motor speed circuit 150 also can derive the time during which the motor rotates 120 degrees by dividing the full cycle elapsed time by 6.

Figure 9:
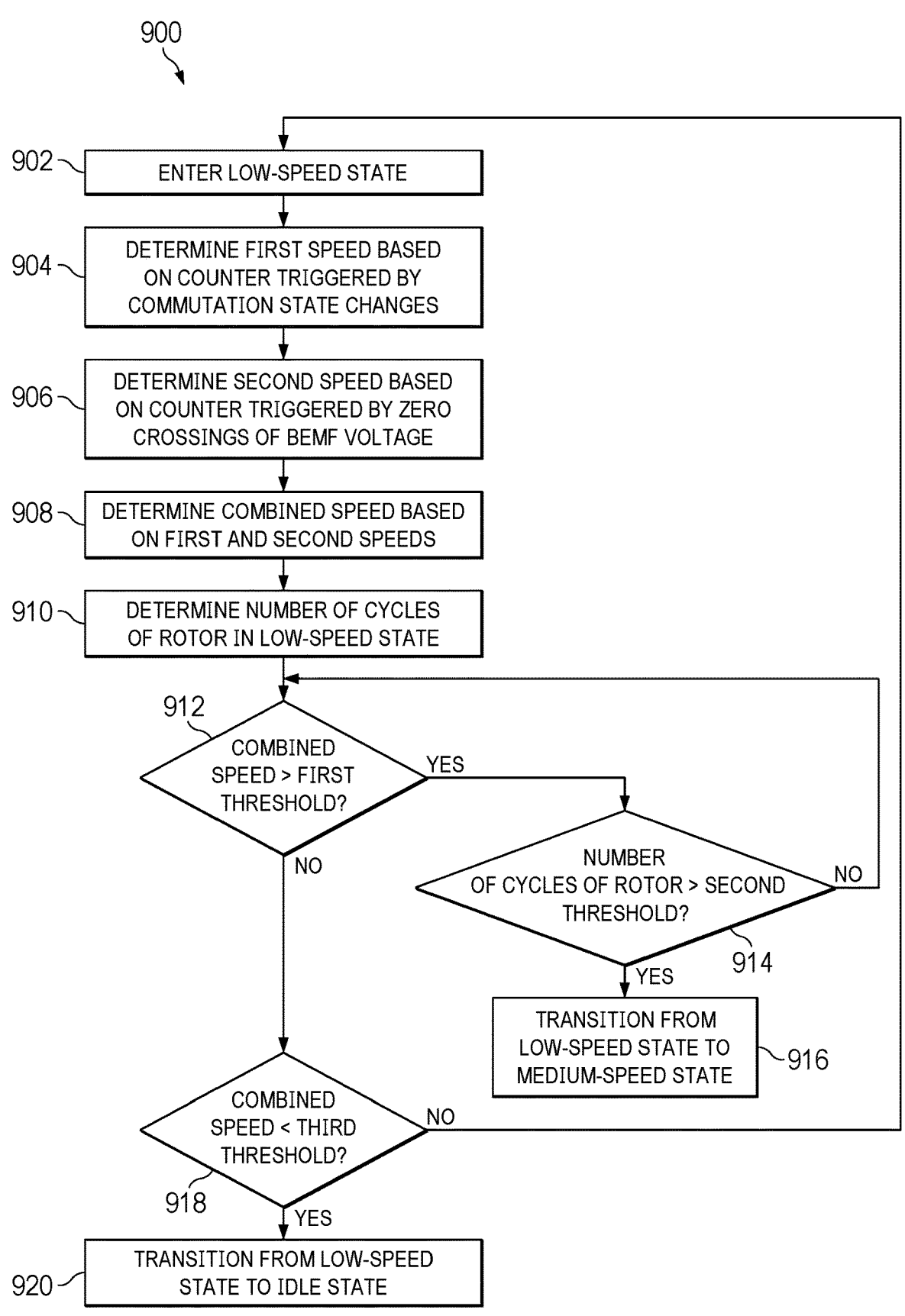
FIG. 9 is a flowchart of a method for transitioning between different speed states of a motor system, in an example.

FIG. 9 is a flow chart 900 of an example method for determining how to transition from the LS_TRAP state 402 (the "low-speed state" in FIG. 9) to the MS_TRAP state 404 (the "medium-speed state" in FIG. 9) and back to the IDLE state 302. Upon entry into the RUN state 310 from the IDLE state 302, motor speed circuit 150 first enters the LS_TRAP state at block 902. At block 904, the method includes determining a first motor speed based on a counter triggered by commutation state changes. In one example, this step can be performed by the motor speed circuit 150 determining the first motor speed based on the count value from the count output 146b of counter 146, which measures the elapsed time associated with changing commutation states as described above. At block 906, the method includes determining a second motor speed based on a counter triggered by BEMF signal zero crossings. In one example, this step can be performed by the motor speed circuit 150 determining the second motor speed based on the count value from the count output 145b of counter 145, which is triggered by the zero crossings of the BEMF signal.

At block 908, the method includes determining a combined motor speed based on the first and second motor speeds determined at blocks 904 and 906, respectively. In one example, the combined motor speed can be a weighted average of the first and second motor speeds. For example, if both first and second motor speeds indicate a speed that is closer to a lower limit of the speed range of the low speed state, the weight for the first motor speed (based on measuring time between commutation state changes) can be increased with respect to the weight for the second motor speed (based on measuring time elapsed between zero crossing). Conversely, if both first and second motor speeds indicate a speed that is closer to an upper limit of the speed range of the low speed state, the weight for the second motor speed can be increased with respect to the weight for the first motor speed. In an example, motor speed circuit 150 can determine the combined motor speed. At block 910, the method includes determining the number of cycles that motor 102 has spun while in the LS_TRAP state 402. Counter 146, or a separate counter (not shown) can be used to count the number of cycles through the six commutation states. Such arrangements can reduce the likelihood of a false speed state transition due to noise in the motor voltages.

At decision block 912, the method includes determining whether the combined speed from block 908 is greater than a first threshold. The first threshold can be a speed associated with the lower speed end of the MS_TRAP state speed range. If the combined speed is greater than the first threshold, then at decision block 914, the method includes determining whether the number of cycles motor 102 has spun while in the LS_TRAP state 402 is greater than a second threshold (e.g., 100 cycles). Motor speed circuit 150 can assess both conditions. If both conditions are true (the motor speed is estimated to be greater than the first threshold and the motor has spun more than the second threshold number of cycles), then at block 916, motor speed circuit 150 transitions from the LS_TRAP state 402 to the MS_TRAP state 404. The logic of blocks 904 to 914 is an example of the LS_TO_MS criteria 403 in FIG. 4. If the combined speed is greater than the first threshold but the motor has not yet spun more than the second threshold number of cycles, then control loops back to decision block 912.

If, at block 912, the combined speed is determined not to be greater than the first threshold, then it is possible that the motor speed is decreasing. Accordingly, at decision block 918, the method includes determining whether the combined speed is less than a third threshold. The third threshold can be associated with a relatively low motor speed (including 0 speed). If the combined motor speed is less than third threshold (e.g., as determined by motor speed circuit 150), then at block 920, motor speed circuit 150 transitions from the LS_TRAP state 402 to the IDLE state 302. If the combined motor speed is not less than the third threshold, then the motor speed is between the third and first thresholds and motor speed circuit 150 remains in the LS_TRAP state 402 and control reverts to block 902.

Figure 10:
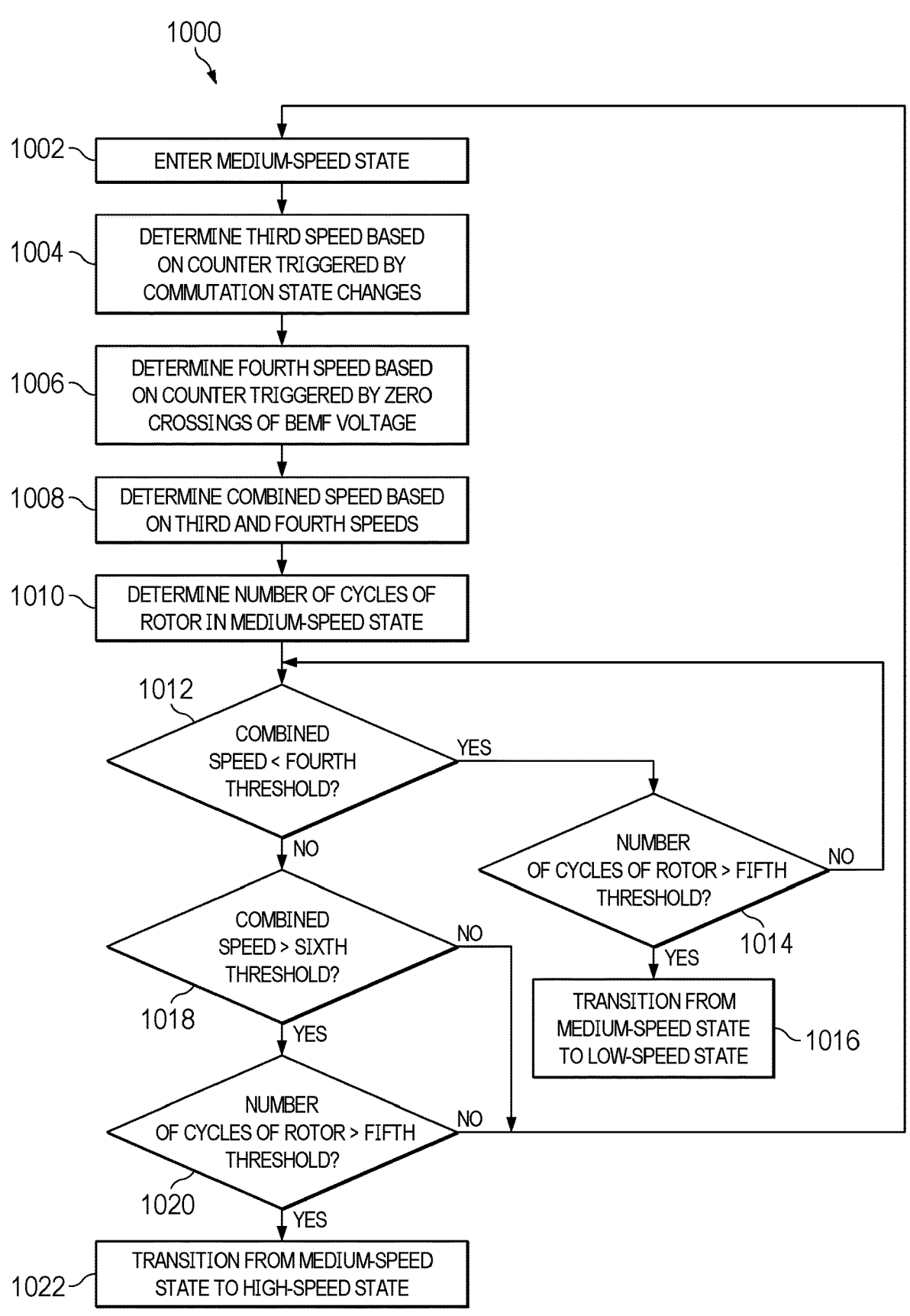
FIG. 10 is a flowchart of a method for transitioning between different speed states of a motor system, in an example.

FIG. 10 is a flow chart 1000 of an example method for determining how to transition from the MS_TRAP state 404 at block 1002 to the HS_TRAP state 406 (the "high-speed state" in FIG. 10) or back to the LS_TRAP state 402. At block 1004, the method includes determining a third motor speed based on a counter triggered by commutation state changes. As described above, this step can be performed by the motor speed circuit 150 determining the third motor speed based on the count value from the count output 146b of counter 146, which measures the elapsed time associated with changing commutation states as described above. At block 1006, the method includes determining a second motor speed based on a counter triggered by BEMF signal zero crossings. As described above, this step can be performed by the motor speed circuit 150 determining the third motor speed based on the count value from the count output 145b of counter 145, which is triggered by the zero crossings of the BEMF signal.

At block 1008, the method includes determining a combined motor speed based on the third and fourth motor speeds determined at blocks 1004 and 1006, respectively. In one example, the combined motor speed can be a weighted average of the third and fourth motor speeds. In an example, motor speed circuit 150 can determine the combined motor speed. At block 1010, the method includes determining the number of cycles that motor 102 has spun while in the MS_TRAP state 402. Counter 146, or a separate counter (not shown) can be used to count the number of cycles through the six commutation states.

At decision block 1012, the method includes determining whether the combined speed from block 1008 is less than a fourth threshold. The fourth threshold can be a speed associated with the upper speed end of the LS_TRAP state speed range. If the combined speed is less than the fourth threshold, then at decision block 1014, the method includes determining whether the number of cycles motor 102 has spun while in the MS_TRAP state 404 is greater than a fifth threshold (e.g., 100 cycles). Motor speed circuit 150 can assess both conditions. If both conditions are true (the motor speed is estimated to be less than the fourth threshold and the motor has spun more than the fifth threshold number of cycles), then at block 1016, motor speed circuit 150 transitions from the MS_TRAP state 404 to the LS_TRAP state 402. The logic of blocks 1004-1014 is an example of the MS_TO_LS criteria 405 in FIG. 4. If the combined speed is less than the fourth threshold but the motor has not yet spun more than the fifth threshold number of cycles, then control loops back to decision block 1012.

If, at block 1012, the combined speed is determined not to be less than the fourth threshold, then it is possible that the motor speed is increasing. Accordingly, at decision block 1018, the method includes determining whether the combined speed is greater than a sixth threshold. The third threshold can be associated with a motor speed at the lower end of the HS_TRAP speed state 406. If the combined motor speed is greater than a sixth threshold (e.g., as determined by motor speed circuit 150) and, per block 1020, if the motor has spun for at least the fifth threshold number of cycle, then at block 1022, motor speed circuit 150 transitions from the MS_TRAP state 404 to the HS_TRAP state 406. The logic of blocks 1004 to 1012, 1018, and 1020 is an example of the MS_TO_HS criteria 407 in FIG. 4. Otherwise, if the combined motor speed is not greater than the sixth threshold, or the motor has not spun for more than the fifth threshold number of cycles, then motor speed circuit 150 remains in the MS_TRAP state 404 and control reverts to block 1002.

FIG. 11 is a flowchart 1100 of an example method for determining how to transition from the HS_TRAP state 404 to the MS_TRAP state 404 when the motor speed decreases. At block, 1102, motor speed circuit 150 is in the HS_TRAP state 406. At block 1104, the method includes determining a motor speed based on the time interval between successive zero crossings of the floating terminal voltage. Motor speed circuit 150 can determine the motor's speed based on the count value from counter 145, as described above. At decision block 1106, the method includes determining (e.g., by motor speed circuit 1106) whether the motor speed determined at block 1104 is below a threshold. The threshold in this example is associated with a speed at the lower end of the HS_TRAP state 406 or the upper end of the MS_TRAP state 404. If the speed is determined to be below the threshold, then at block 1108, motor speed circuit 150 transitions from the HS_TRAP state 406 to the MS_TRAP state 404. The logic of blocks 1104 and 1106 is an example of the HS_TO_MS criteria 409 in FIG. 4. Otherwise, if the speed is determined not to be below the threshold, then control loops back to block 1102 and motor speed circuit 150 remains in the HS_TRAP state 406.

FIG. 12 is a flowchart 1200 illustrating a method for motor commutation controller 130 to employ when determining when to change commutation states with motor speed circuit 150 in the LS_TRAP state 402. At block 1202, motor commutation controller 130 enters a first commutation state. The first commutation state may be any of commutation states S0 to S5. At block 1204, motor commutation controller 130 provide a measurement of the floating terminal voltage of motor 102 to a look up table that maps different commutation states to different commutation voltages (e.g., LUT 137). At block 1206, motor commutation controller 130 determines a next commutation state or remains in the current commutation state based on the output of the lookup table.

FIG. 13 is a flowchart 1300 illustrating a method for motor commutation controller 130 to employ when determining when to change commutation states with motor speed circuit 150 in the MS_TRAP state 402 or the HS_TRAP state 406. At block 1302, motor commutation controller 130 enters a first commutation state. The first commutation state may be any of commutation states S0 to S5. At block 1304, motor commutation controller 130 receives a signal at its first voltage transition input 132 from comparator 121 indicating the occurrence of a zero crossing of the BEMF voltage. Counter 145 also may be triggered to begin counting in response to the comparator's output signal.

At block 1306, motor commutation controller 130 determines a value for a delay based on a count value from counter 145 from a prior commutation state. For example, counter 145 can generate a count value between a previous consecutive pair of commutation states. This count value is related to motor speed—e.g., count value is inversely related to motor speed. At decision bock 1308, the count value of counter 145 during the current commutation state can be compared by motor commutation controller 130 to the delay determined at block 1306. If the current count value is greater than the delay, then at block 1310, commutation controller 130 updates its commutation state signal 181 to direct the motor inverter driver 112 to change to the next commutation state. Otherwise, if the current count value is not yet greater than the delay, control loops back to decision block 1308.

FIG. 14 is a flowchart 1400 illustrating a method 1400 for controlling a motor. Method 1400 can include example methods and operations described in, for example, FIG. 3, FIG. 4, and FIGS. 9-13. Method 1400 can be performed by various components of system 100 including, for example, motor inverter driver 112, motor commutation controller 135, and motor speed circuit 150.

At block 1402, motor speed circuit 150 can receive a first measurement signal representing a first time between transitions of prior motor commutation states. The first measurement signal can be received from, for example, counter 146, by counting the time between transitions of commutation states based on commutation state signal 181 provided by motor commutation controller 135.

At block 1404, motor speed circuit 150 can receive a second measurement signal representing a second time between transitions (e.g., zero-crossing) of a motor floating terminal voltage (e.g., $V_{an}$, $V_{bn}$, $V_{cn}$). The second measurement signal can be received from, for example, counter 145.

At block 1406, motor speed circuit 150 can determine a speed state based on a combination of the first and second measurement signals. For example, motor speed circuit 150 can be in one of a low speed state, a medium speed state, or a high speed state, each associated with a particular motor speed range. Motor speed circuit 150 can determine a motor speed based on a combination of the first and second measurement signals, and determine whether to remain in a particular speed state or move to a different speed state, based on the combination, as described in FIG. 4 and FIGS. 10-12. Motor speed circuit 150 can also have an idle state and an IPD_SS state and transition from those states to a RUN state that can include the multiple speed states based on other inputs, such as user input, current, etc., as described in FIG. 3.

At block 1408, motor commutation controller 135 can determine a current motor commutation state based on the motor speed state and the motor floating terminal voltage. As described above (e.g., FIG. 12), if the motor (and motor speed circuit 150) is in the low speed state where the mutual inductance voltage dominates the commutation voltage/floating terminal voltage, motor commutation controller 135 can provide digital signals 127 representing the level of the commutation voltage ($V_{an}$, $V_{bn}$, or $V_{cn}$) to a lookup table (e.g., LUT 137) to determine the current commutation state. Also, if the motor is in the medium or high speed state where the back EMF dominates the commutation voltage/floating terminal voltage, motor commutation controller 135 can determine the current commutation state based on detecting a zero-crossing in the floating terminal voltage, and transition to a next commutation state after an offset time has elapsed from the zero-crossing. The offset time can be determined based on a motor speed determined from the second measurement signal.

At block 1410, motor inverter driver 112 can provide control signals to the motor via an inverter (e.g., inverter 114) based on the current commutation state. For example, depending on the current commutation state (indicated by commutation state signal 181), one of the half bridges of inverter 114 can be in the floating state, and transistors of the other half bridges can be enabled/disabled, as described above. One of closed-loop speed controller 110 or motor speed circuit 150 can also provide a speed control signal to motor inverter driver 112, which can set the duty cycle/pulse width of the control signals to set the motor speed.

Figure 15:
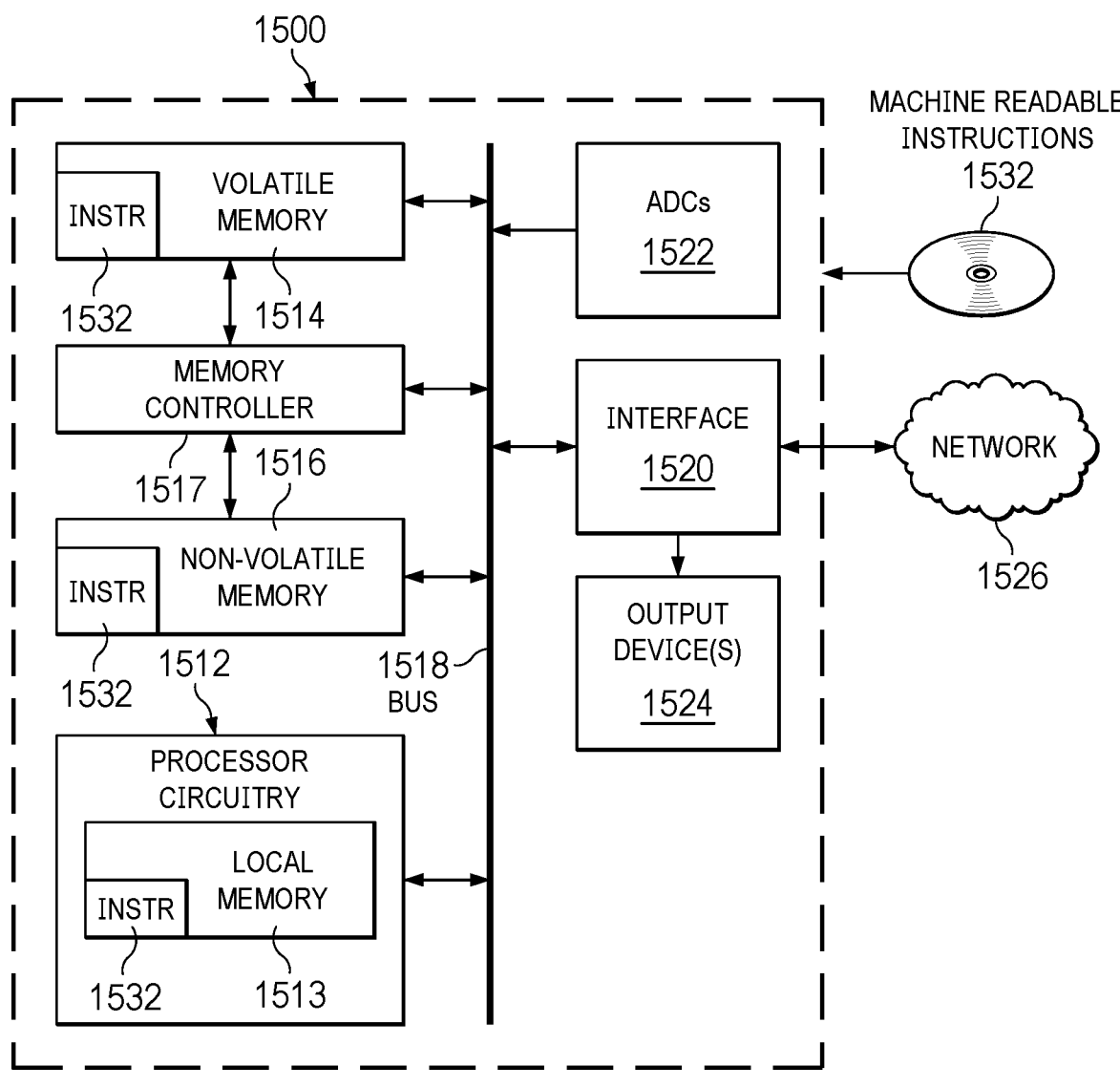
FIG. 15 is a schematic of an example processor that can implement part of the motor system of FIG. 1, in an example.

FIG. 15 is a block diagram of an example processor platform 1500 including processor circuitry structured to execute machine-readable instructions to implement the logic depicted in the example motor system 100 of FIG. 1 and the methods of FIGS. 9-14. Processor platform 1500 of the illustrated example can include processor circuitry 1412. The processor circuitry 1512 of the illustrated example includes hardware. For example, processor circuitry 1512 can be implemented by one or more integrated circuits, logic circuits, FPGAs, microprocessors, central processing units (CPUs), graphical processing units (GPUS), digital signal processors (DSPs), and/or microcontrollers from any desired family or manufacturer. Processor circuitry 1512 can be implemented by one or more semiconductor-based (e.g., silicon-based) devices. In this example, processor circuitry 1512 can implement motor commutation controller 130, time measurement circuit 140, and motor speed circuit 150 of FIG. 1.

Processor circuitry 1512 of the illustrated example can include a local memory 1513 (e.g., a cache, registers, etc.). Processor circuitry 1512 of the illustrated example is in communication with a computer-readable storage device such as a main memory including a volatile memory 1514 and a non-volatile memory 1516 by a bus 1518. The volatile memory 1514 can be implemented by, for example, Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1516 may be implemented by programmable read-only memory, flash memory and/or any other desired type of non-volatile memory device. Access to the main memory 1514, 1516 of the illustrated example can be controlled by a memory controller 1517.

The processor platform 1500 of the illustrated example also includes interface circuitry 1520. The interface circuitry 1520 may be implemented by hardware in accordance with any type of interface standard, such as an Inter-Integrated Circuit (I2C) interface, a Serial Peripheral Interface (SPI), an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input ADCs 1522 are connected to bus 1518. The ADCs 1522 can convert analog signals to digital signals for processing by the processor circuitry 1512. One or more of ADCs 1522 can implement ADC 123 in FIG. 1. Examples of such analog signals include the BEMF signal and motor current.

One or more output devices 1524 can be connected to the interface circuitry 1520 of the illustrated example. The output device(s) 1524 can include circuits such as driver circuits for generating, for example, the commutation state signal 181 to motor inverter driver 112.

Machine-readable instructions 1532 can be stored in volatile memory 1514 and/or non-volatile memory 1516. Upon execution by the processor circuitry 1512, the machine-readable instructions 1532 cause the processor platform 1500 to perform any or all of the functionality described herein attributed to the motor system 100.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. An apparatus comprising:
   a time measurement circuit having a first voltage transition input, a commutation state input, a first time measurement output, and a second time measurement output;
   a motor commutation controller having a signal measurement input, a second voltage transition input, a speed state input, and a commutation state output, the second voltage transition input coupled to the first voltage transition input, the commutation state output coupled to the commutation state input;
   a motor speed circuit having a first time measurement input, a second time measurement input, and a speed state output, the first time measurement input coupled to the first time measurement output, the second time measurement input coupled to the second time measurement output, and the speed state output coupled to the speed state input; and
   a motor inverter driver circuit having a motor control input coupled to the commutation state output of the motor commutation controller.

2. The apparatus of claim 1, further comprising a voltage processing circuit having voltage processing inputs, a control input, a first motor voltage output, and a second motor voltage output, wherein the motor inverter driver circuit has motor control outputs coupled to the voltage processing inputs, and wherein at least one of the first motor voltage output or the second motor voltage output is coupled to the signal measurement input of the motor commutation controller.

3. The apparatus of claim 2, wherein the voltage processing circuit includes:
   a voltage multiplexer circuit having multiplexer inputs, a selection input, and a multiplexor output, the multiplexer inputs coupled to the voltage processing inputs, the selection input coupled to the control input, and the multiplexor output coupled to the first motor voltage output; and
   a voltage summation circuit having summation inputs and a summation output, the summation inputs coupled to the voltage processing inputs, and the summation output coupled to the second motor voltage output.

4. The apparatus of claim 2, further comprising a comparator having a first comparator input, a second comparator input, and a comparator output, the first comparator input coupled to the first motor voltage output, the second comparator input coupled to the second motor voltage output, and the comparator output coupled to the first voltage transition input and the second voltage transition input.

5. The apparatus of claim 2, further comprising an analog-to-digital converter (ADC) having an ADC input and an ADC output, the ADC output coupled to the signal measurement input of the motor commutation controller, and the ADC input coupled to at least one of the first motor voltage output, the second motor voltage output, the voltage processing inputs, or a motor current sensing terminal coupled to the motor inverter driver circuit.

6. The apparatus of claim 1, wherein the motor commutation controller includes a is configured to:
   responsive to a first speed state received at the speed state input, determine a commutation state based on a first signal at the signal measurement input;
   responsive to a second speed state received at the speed state input, determine the commutation state based on a second signal at the second voltage transition input; and
   provide an indication of the commutation state at the commutation state output.

7. The apparatus of claim 6, wherein the communication state is a first commutation state, the motor commutation controller is configured to transition between commutation states, the commutation states include the first commutation state and at least a second commutations state, and the motor commutation controller is configured to:
   withhold transition from the first commutation state to the second commutation state within a blanking window that begins at an end of the first commutation state; and
   transition from the first commutation state to the second commutation state after expiration of the blanking window.

8. The apparatus of claim 7, wherein:
   the motor commutation controller is configured to receive a current measurement signal at the signal measurement input and adjust the blanking window based on the current measurement signal.

9. The apparatus of claim 7, wherein the motor commutation controller has a blanking time output, and the motor speed circuit has a blanking time input, the motor commutation controller configured to provide a timing signal representing a start time and a duration of a blanking timing window at the blanking time output, and the motor speed circuit is configured to withhold transition to a next speed state within the blanking timing window responsive to the timing signal.

10. The apparatus of claim 1, wherein the time measurement circuit includes:
   a first counter having a first counter control input and a first counter output, the first counter control input coupled to the first voltage transition input, and the first counter output coupled to the first time measurement output; and
   a second counter having a second counter control input and a second counter output, the second counter control input coupled to the commutation state input, and the second counter output coupled to the second time measurement output.

11. The apparatus of claim 10, wherein the motor speed circuit has multiple speed states including a first speed state and a second speed state, and the motor speed circuit is configured to:
   transition between the first speed state and the second speed state based on a combination of a first signal at the first time measurement input and a second signal at the second time measurement input; and
   provide an indication of the first or second speed state at the speed state output.

12. The apparatus of claim 11, wherein the first speed state is associated with a first speed range, the second speed state is associated with a second speed range, and the second speed range has larger maximum and minimum magnitudes than the first speed range.

13. The apparatus of claim 12, wherein the multiple speed states include an idle state and an initial position detection (IPD) state, and the first speed range starts at zero.

14. The apparatus of claim 13, wherein the motor speed circuit has a trigger input and is configured to transition from the idle state to the IPD state responsive to a state of the trigger input.

15. The apparatus of claim 14, wherein the motor speed circuit includes a de-glitch circuit coupled to the trigger input, and the motor speed circuit is configured to transition from the idle state to the IPD state responsive to a state of an output of the de-glitch circuit.

16. The apparatus of claim 14, wherein the motor speed circuit has a current sensing input and is configured to transition from the IPD state back to the idle state responsive to a current measurement signal at the current sensing input exceeding a threshold.

17. The apparatus of claim 12, wherein the motor speed circuit has a motor speed output, and the motor speed circuit is configured to:
   in the first speed state, provide a motor speed signal at the motor speed output based on the second signal at the second time measurement input; and
   in the second speed state, provide the motor speed signal at the motor speed output based on the first signal at the first time measurement input.

18. The apparatus of claim 17, wherein the combination of the first signal and the second signal is a combination of a scaled version of the first signal and a scaled version of the second signal, in which the first signal is scaled by a first scaling factor and the second signal is scaled by a second scaling factor.

19. The apparatus of claim 18, wherein the multiple speed states include a third speed state associated with a third speed range, the third speed range being between the first and second speed ranges.

20. The apparatus of claim 19, wherein the motor speed circuit is configured to exit the first speed state and enter the third speed state responsive to the combination exceeding a first threshold.

21. The apparatus of claim 20, wherein the motor speed circuit is configured to exit the first speed state and enter the third speed state responsive to the motor speed circuit having been in the first speed state for a number of motor rotation cycles exceeding a second threshold.

22. The apparatus of claim 20, wherein the motor speed circuit is configured to exit the second speed state and enter the third speed state responsive to the combination being below a threshold, in which the second scaling factor is zero.

23. The apparatus of claim 17, wherein the motor inverter driver circuit includes a motor speed controller and a pulse width modulation (PWM) controller, the motor speed controller having a first speed input, a reference speed input, and a speed control output, the PWM controller having a PWM input and a PWM output, the first speed input coupled to the motor speed output, and the PWM input coupled to the motor control input and the commutation state output,
   wherein the motor inverter driver circuit further includes an inverter driver having an inverter driver input coupled to the PWM output.

* * * * *